(12) United States Patent
Takahashi et al.

(10) Patent No.: US 7,162,657 B2
(45) Date of Patent: Jan. 9, 2007

(54) SEMICONDUCTOR STORAGE DEVICE AND CONTROLLING METHOD THEREFOR

(75) Inventors: Hiroyuki Takahashi, Kanagawa (JP); Yuuji Matsui, Kanagawa (JP); Masatoshi Sonoda, Kanagawa (JP); Yosiyuki Kato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 463 days.

(21) Appl. No.: 10/639,716

(22) Filed: Aug. 12, 2003

(65) Prior Publication Data

US 2004/0032769 A1  Feb. 19, 2004

(30) Foreign Application Priority Data

Aug. 15, 2002  (JP)  ............... 2002-236950

(51) Int. Cl.
*G06F 1/12* (2006.01)
(52) U.S. Cl. .................................................. 713/400
(58) Field of Classification Search ................ 713/400, 713/500, 501, 502, 503
See application file for complete search history.

(56) References Cited

U.S. PATENT DOCUMENTS 6,029,250 A * 2/2000 Keeth ........................ 711/167
6,247,073 B1 * 6/2001 Takeda ....................... 711/167
6,330,682 B1 * 12/2001 Kanazashi et al. .......... 713/400

OTHER PUBLICATIONS

"QDR II SRAM: A Design Guide", © Jun. 12, 2002, Cypress Semiconductor Corporation, p. 1-6.*
"18Mb QDR II SRAM 2-Word Burst", © 2003 Micron Technology, Inc., p. 1-27.*

* cited by examiner

*Primary Examiner*—Brian R. Peugh
(74) *Attorney, Agent, or Firm*—Muirhead & Saturnelli, LLC

(57) ABSTRACT

A semiconductor storage device includes a circuit receiving a command signal for generating a read control signal (RPB) based on the transition of a clock signal CLK and a circuit receiving the command signal for generating a write control signal (WPB) based on the transition of the clock signal CLK. The read cycle in which decoding of an address, selection of a word line and activation of a sense amplifier are executed based on the read control signal to read cell data, and the write cycle in which decoding of an address, selection of a word line and activation of a write amplifier are executed based on the write control signal and bit line pre-charging is also carried out, are carried out alternately. The sense period of the read cycle is overlapped with the decoding period of the write cycle.

7 Claims, 17 Drawing Sheets

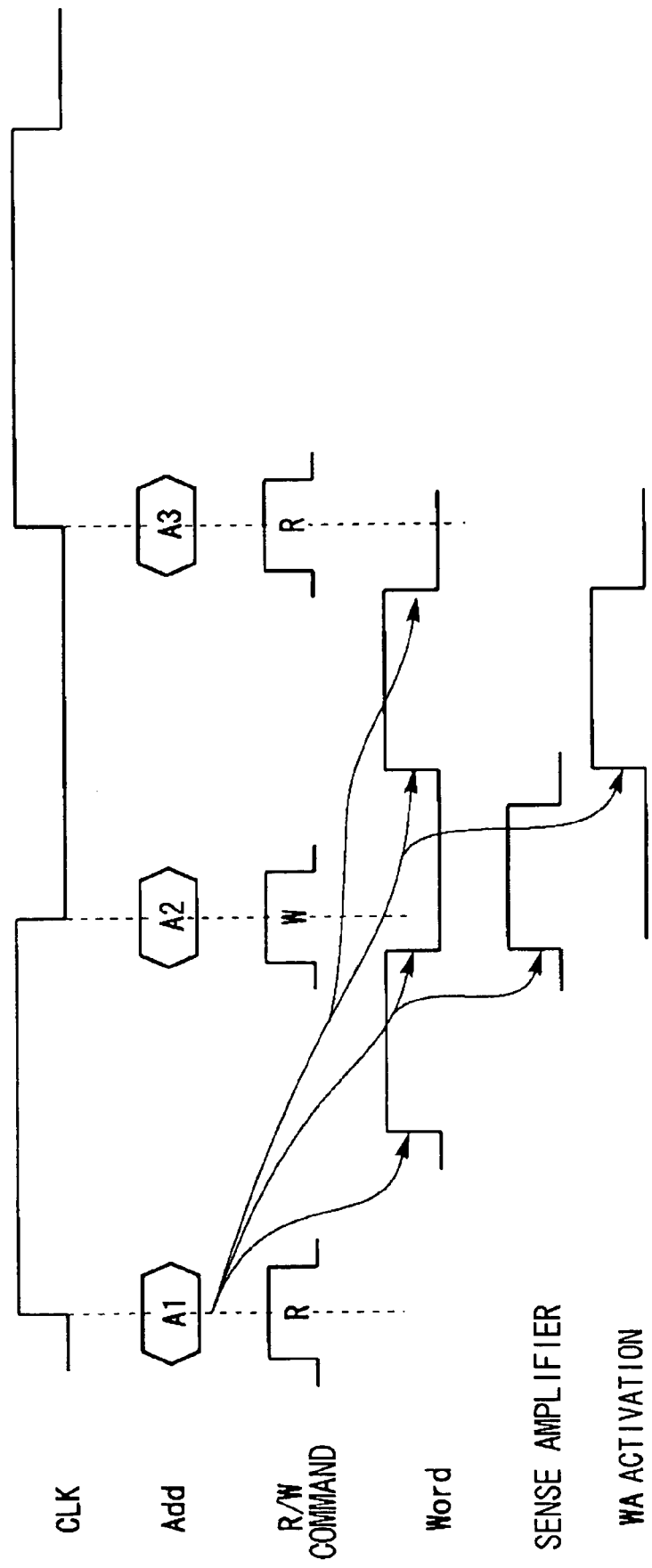

SEMICONDUCTOR STORAGE DEVICE AND CONTROLLING METHOD THEREFOR

FIELD OF THE INVENTION

This invention relates to a semiconductor storage device and, more particularly, to an architecture of a semiconductor storage device suited for improving operating speed and method for controlling the semiconductor storage device.

BACKGROUND OF THE INVENTION

Recently, an ultra-high-speed optical communication standard, such as OC-192 (10 Gbps) or OC-768 (40 Gbps) has obtained general acceptance in communication equipment, such as a switch or a router. As an SRAM (static random access memory) technique for implementing the data transfer rate complying with these standards, QDR (Quad Data Rate)/DDR (Double Data Rate) has been jointly developed. For example, QDRII/DDRII SRAM is of the specifications supporting the maximum operating frequency up to 333 MHz (NEC Press Release: Apr. 15, 2002-2: "http://www.nec.co.jo/press/ja/0204/1502/html"). In the QDRII architecture, a data port is divided into an input port and an output port (I/O separation), these ports each operating at a double rate. Meanwhile, QDR is a registered trademark owned by IDT Inc. and Micron Inc.

In the DDR, a read cycle of reading data from a memory cell array and a write cycle of writing data in the memory cell array occur in alternation with each other.

Referring to FIG. 2, the outline of the QDR type memory device is described. Meanwhile, FIG. 2 is a diagram which is referred in the detailed description of the embodiment of the present invention. In FIG. 2, there are provided a plural number of memory cell array blocks 10 of the same structure. In FIG. 2, the structure of one memory cell array block 10 is shown. The cell array block 10 includes a cell array 100, an X selection circuit 101 which comprises an X-decoder for decoding X addresses, a word driver driving a word line selected as a result of decoding by the X-decoder, circuits 103 which comprises a Y selection circuit having a Y decoder for decoding a Y address, a Y switch connecting the bit line of the column selected as a result of decoding by the Y decoder to a sense amplifier or to a write amplifier, a sense amplifier SA and a write amplifier WA, and a control circuit 102.

An input register 109, which composes an input port, samples write data from an input terminal Din, in synchronism with a clock signal CLK, and sends the sampled write data over a write bus to the write amplifier WA. An output register 108, having an input terminal connected to a read bus, to which data from the sense amplifier SA is output, samples read data (read data) in synchronism with the clock signal CLK, to output the sampled data at an output terminal Dout.

A read pulse generator 106 receives a read/write (R/W) command and outputs a read control pulse RPB during the read (read) operation to a control circuit 102.

A write pulse generator 107 receives a read/write command and outputs a write control pulse WPB during the write operation to the control circuit 102.

An address clock generator 105 receives a read/write command and generates and outputs a read clock RC and a write clock WC at a transition edge of the clock signal CLK.

An address register 104 receives an address signal Add from a memory controller or a chip set and samples the address signal with the rising edge of the clock signal CLK.

When the read clock RC or the write clock WC are activated, the address register 104 outputs the sampled address (X-address, Y-address and block selection address). The X-address, Y-address and the block selection address are supplied to the X-decoder, Y-decoder and to for example the control circuit 102, respectively. The control circuit 102 receives a read control pulse RPB and a write control pulse WPB and generates a read activation signal and a write activation signal used in the memory array block 10 to control the activation of the selected word line, the sense amplifier SA and the write amplifier WA.

As described above, the memory device includes plural cell array blocks 10, thus elongating the bus length of the read bus and the write bus or the length of the signal interconnection for control signals for the read controlling pulses RPB and the write controlling pulses WPB. As the operating frequency of the memory device is increased, that is, the clock period is shortened, the skew between the far and near ends of the signal interconnection has become marked and cannot be disregarded. The increase of the memory capacity brings about an increased bit width of address signals and an increased number of stages of the circuits making up the decoder, such as X-decoder, while also the skew of change points of an inner address signal supplied to the cell array as a result of address decoding becomes marked.

In the design specification of for e.g. QDR, read and write cycles occur alternately. In this case, the cycle time is determined taking the skew of control signals, such as RPB or WPB, and an inner address signal into account.

SUMMARY OF THE DISCLOSURE

In the above mentioned circuit configuration, during a read cycle, the voltage appearing on a bit line responsive to data stored in the selected memory cell is amplified by a sense amplifier which composes a read circuit for outputting read data. During a write cycle, a bit line is driven with a full-swing signal voltage by the write amplifier which composes a write circuit to effect writing data in a selected memory cell. Thus, in a cell array block, the read operation is more time-consuming than the write operation. In a memory system of such structure in which the read cycle and the write cycle occur alternately, the maximum operating frequency is limited by the read cycle with the longer cycle time.

Accordingly, it is an object of the present invention to provide a semiconductor storage device, a semiconductor device, and a controlling method therefor, by which the operating frequency may be improved further.

The above and other objects are attained by a semiconductor device in accordance with one aspect of the present invention, which comprises a first circuit activated for a predetermined preset period when one of a first control signal generated based on a first transition of an input clock signal and a second control signal generated based on a second transition of a cycle next following the first transition of the clock signal is activated, and a second circuit activated for a predetermined preset period when a third signal generated based on the first transition of the clock signal is activated. The second circuit operates responsive to an output result of the first circuit. The semiconductor device also comprises a third circuit activated for a predetermined preset period when a fourth signal generated based on the second transition of the clock signal is activated. The third circuit operates responsive to an output result of the first circuit. A sequence of operations by the first and second circuits, sequentially activated in accordance with the control signal generated from the first transition of the clock signal, forms a first operating cycle, whilst a sequence of operations by the first and third circuits, sequentially activated in accordance with the control signal generated from the second transition of the clock signal, forms a second operating cycle. The semiconductor device also comprises a circuit for performing control so that the first operating cycle and the second operating cycle are carried out alternately, and a circuit for controlling the timing of the control signal relevant to activation of the second circuit in the first operating cycle and the timing of the control signal relevant to activation of the first circuit in the second operating cycle so that a portion of the operation of the second circuit in the first operating cycle is temporally overlapped with the operation of the first circuit in the second operating cycle.

In accordance with another aspect of the present invention, there is also provided, a semiconductor storage device comprising a memory cell array having a plurality of memory cells, an address register for sampling an input address signal by an input clock signal and for being activated for a predetermined preset time on activation of one of a first control signal generated based on a first transition of the clock signal and a second control signal generated based on a second transition of a cycle next following the first transition of the clock signal, to output the sampled address signal, a decoder receiving the address signal produced at an output of the address register, a circuit for generating a third control signal for activating read operation, based on the first transition of the clock signal and for generating a fourth control signal for activating write operation based on the second transition of the cycle next following the first transition of the clock signal, a circuit activated a predetermined preset time on activation of one of the third control signal generated based on the first transition of the clock signal and the fourth control signal to activate a word line selected by the decoder to select the word line, a sense amplifier activated a predetermined preset time on activation of a fifth control signal generated based on the first transition of the clock signal to amplify data read on a bit line of the selected cell to output the amplified data as read data, and a write amplifier activated a predetermined preset time on activation of a sixth control signal generated based on the second transition of the clock signal to effect writing data in the selected cell. An address decoding operation by the decoder, a word line selecting operation activating the word line selected by the decoder, and a sense operation by the sense amplifier, sequentially activated by the control signal generated from the first transition of the input clock signal, form a read cycle, whilst an address decoding operation by the decoder, a word line selecting operation by a circuit activating the word line selected by the decoder, and a write operation by the write amplifier, sequentially activated by the control signal generated from the second transition of the input clock signal, form a write cycle. The semiconductor storage device also comprises a circuit for exercising control so that the read cycle and the write cycle will occur alternately, and a circuit for controlling the timing so that the sense operation by the sense amplifier in the read cycle and the address decoding operation by the decoder in the write cycle next following the read cycle will occur in parallel.

A semiconductor storage device, in accordance with still another aspect of the present invention, comprises an address clock generating circuit for generating a read clock (RC) in accordance with an input read command, based on a first transition of an input clock signal, and for generating a write clock (WC) in accordance with an input write command, based on a second transition of a cycle next following the first transition of the clock signal, an address register for sampling an input address signal based on the clock signal and for receiving the read clock (RC) and the write clock (WC), output from the address clock generating circuit, as inputs, to output the sampled address signal when one of the read clock (RC) and the write clock (WC) is activated, a read pulse generating circuit for generating a read pulse signal (RPB) based on the first transition of the clock signal, a write pulse generating circuit for generating a write pulse signal (WPB) based on the second transition of the clock signal, a memory cell array having a plurality of memory cells, a decoder for receiving the address signal, produced as an output from the address register, for decoding the received address signal, a circuit for receiving a read pulse signal (RPB) from the read pulse generating circuit to generate a one-shot read pulse (ROS) based on the read pulse signal (RPB), a circuit for receiving a write pulse signal (WPB) from the write pulse circuit to generate a one-shot write pulse (WOS) based on the write pulse signal (WPB), a circuit for receiving the read one-shot pulse signal (ROS) and the write one-shot pulse signal (WOS) and for being activated for a predetermined preset time on activation of one of the read one-shot pulse signal (ROS) and the write one-shot pulse signal (WOS) to activate the selected word line responsive to an output result of the decoder, a circuit for activating a sense enable signal (SE) in accordance with an input read command, based on the first transition of the clock signal, a sense amplifier activated a predetermined preset period, on activation of the sense enable signal (SE) and amplifying data read on a bit line of a selected cell to send out the amplified data as output read data, a circuit for outputting a write amplifier (WA) activation signal, in accordance with the input write command, based on the second transition of the clock signal, and a write amplifier activated a predetermined preset period, when the write amplifier (WA) activation signal indicates activation, to effect writing data in the selected cell. An address decoding operation by the decoder, a word line selecting operation by the circuit activating the selected word line and a sense operation by the sense amplifier, sequentially activated by the read clock and the pulse signal, generated from the first transition of the clock signal, form a read cycle, while an address decoding operation by the decoder, a word line selecting operation by the circuit activating the selected word line, and a write operation by the write amplifier, sequentially activated by the write clock and the pulse signal, generated from the second transition of the clock signals, form a write cycle. The semiconductor storage device according to the present invention, also comprises a circuit for exercising control to effect the read and write cycles alternately, and a circuit for controlling the timing so that the sense operation by the sense amplifier in the read cycle and the address decoding operation by the decoder in the write cycle in the cycle next following the read cycle occur alternately.

In still another aspect of the present invention, there is provided a semiconductor device which comprises a first circuit activated by a first control signal generated based on a first transition of an input clock signal to effect a first operation for a first time period A, and a second circuit activated by a second control signal generated based on a second transition next following the transition of the input clock signal to effect a second operation for a second time period B, the first operation and the second operation performing alternate cyclic operations, wherein the semiconductor device further comprises means setting the period of sad clock signal to (A+B)/2 and for adding a delay of time (A−B)/2 to the delay of the clock signal as from the first transition until the start of the operation of the first circuit when A>B.

A semiconductor device, according to still another aspect of the present invention, further comprising means for setting the period of the clock signal to (A+B)/2 and for adding a delay of time (B−A)/2 to the delay of the clock signal as from the first transition until the start of the operation of the first circuit when B>A.

In accordance with yet another aspect of the present invention, there is provided a method for controlling a semiconductor storage device, in which the method comprises (a) a step of generating a read clock (RC) in accordance with an input read command, based on a first transition of an input clock signal, and generating a write clock (WC), in accordance with an input write command, based on a second transition of a cycle next following the first transition of the clock signal, by an address clock generating circuit, (b) a step of an address register sampling an input address signal based on the clock signal and receiving the read clock (RC) and the write clock (WC), as inputs, to output the sampled address signal when one of the read clock (RC) and the write clock (WC) is activated, (c) a step of a read pulse generating circuit generating a read pulse signal (RPB) based on the first transition of the clock signal, (d) a step of a write pulse generating circuit generating a write pulse signal (WPB) based on the second transition of the clock signal, (e) a step of a control circuit receiving a read pulse signal (RPB) from the read pulse generating circuit to generate a one-shot read pulse signal (ROS) based on the read pulse signal (RPB), in a cell array block made up by a plurality of memory cells, a decoder for receiving an address signal output from the address register, the control circuit, a sense amplifier and a write amplifier, (f) a step of the control circuit receiving a write pulse signal (WPB) from the write pulse circuit to generate a one-shot write pulse (WOS) based on the write pulse signal (WPB), (g) a step of a word driver receiving the read one-shot pulse signal (ROS) and the write one-shot pulse signal (WOS) activated for a predetermined preset time on activation of one of the read one-shot pulse signal (ROS) and the write one-shot pulse signal (WOS) to activate the selected word line responsive to an output result of the decoder, (h) a step of the control circuit activating a sense enable signal (SE) in accordance with an input read command, based on the first transition of the clock signal, (i) a step of the sense amplifier being activated a predetermined preset period, on activation of the sense enable signal (SE), for amplifying data read on a bit line of a selected cell to output the amplified data as read data, (j) a step of the control circuit outputting a write amplifier (WA) activation signal, in accordance with the input write command, based on the second transition of the clock signal, (k) a step of the write amplifier being activated a predetermined preset period, based on the write amplifier (WA) activation signal, to effect writing data in the selected cell, an address decoding operation by the decoder, a word line selecting operation by the circuit activating the selected word line and a sense operation by the sense amplifier, sequentially activated by the read clock and the pulse signal, generated from the first transition of the clock signal, forming a read cycle, and an address decoding operation by the decoder, a word line selecting operation by the circuit activating the selected word line, and a write operation by the write amplifier, sequentially activated by the write clock and the pulse signal, generated from the second transition of the clock signals, forming a write cycle, (l) a step of performing control to effect the read cycle and the write cycle alternately, and (m) a step of controlling the timing so that the sense operation by the sense amplifier in the read cycle and the address decoding operation by the decoder in the write cycle in a cycle next following the read cycle occur in parallel.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 15 is a timing diagram for illustrating the operation of a modification of the present invention.

PREFERRED EMBODIMENTS OF THE INVENTION

Figure 1:
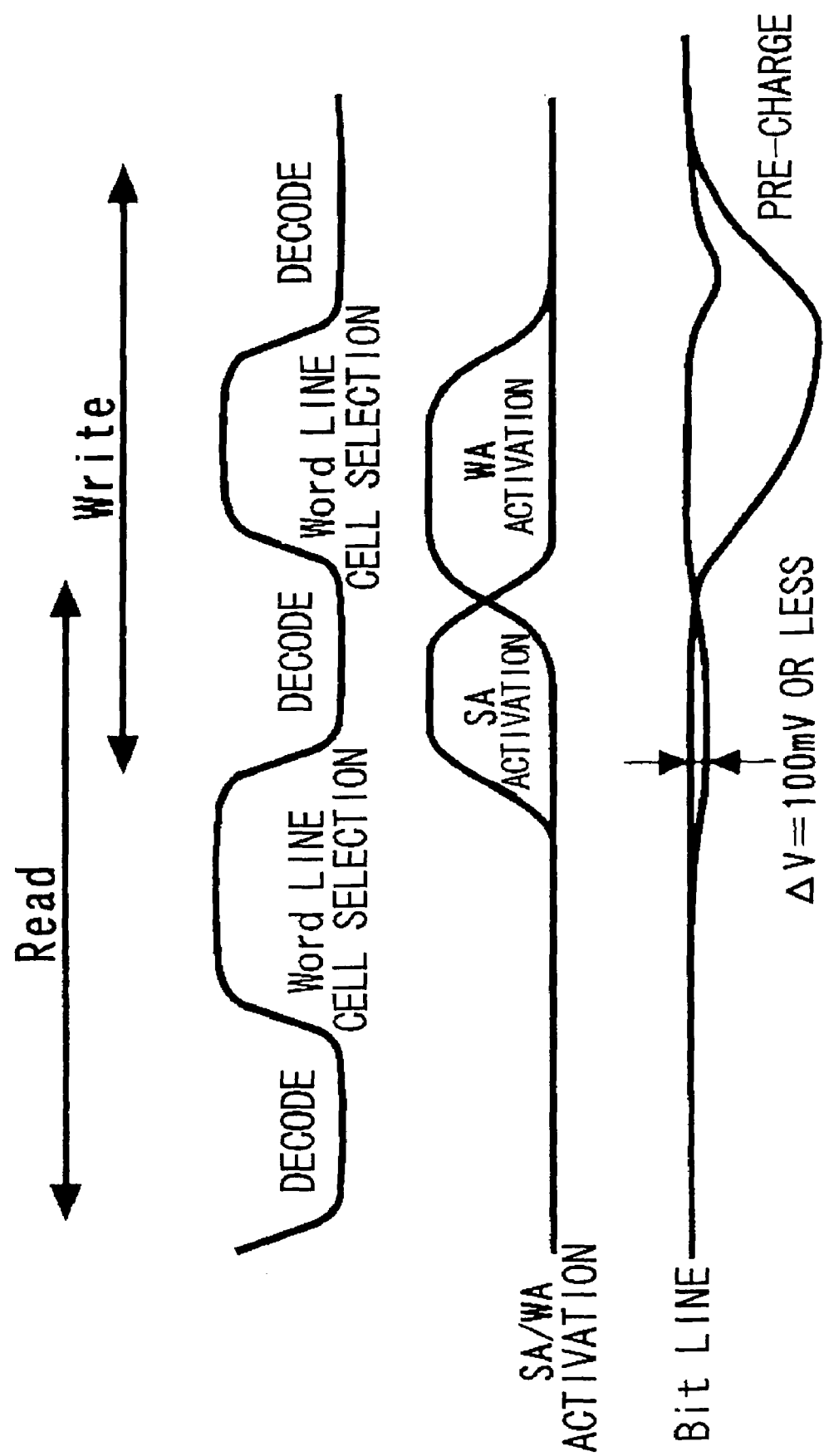
FIG. 1 illustrates the operating principle of the present invention.

Several embodiments of the present invention are hereinafter explained. A semiconductor device, according to one embodiment of the present invention, comprises first to sixth circuits as described below. The first circuit (e.g. an address decoder circuit, such as an address register, an X-selection circuit or a Y-selection circuit) is activated for a predetermined preset period when one of a first control signal generated based on a first transition of an input clock signal and a second control signal generated based on a second transition of a cycle next following the first transition of the clock signal is activated. The second circuit (such as a word line driving circuit for selecting a word line in the X-selection circuit of FIG. 2, and a control circuit therefor, see FIG. 5C) is activated for a predetermined preset period when one of a third signal generated based on the first transition of the clock signal and a fourth signal generated based on a second transition of a cycle next following the first transition of the clock signal is activated, for operating responsive to an output result of the first circuit. The third circuit(such as sense amplifier SA of FIG. 2) is activated for a predetermined preset period when a fifth control signal generated based on the first transition of the clock signal is activated, and operating responsive to an output result of the second circuit. The fourth circuit (such as a write amplifier WA of FIG. 2) is activated for a predetermined preset period when a sixth signal generated based on the second transition of the clock signal is activated. This fourth circuit may be activated simultaneously as the second circuit. A sequence of operations by the first, second and third circuits, which are sequentially activated in accordance with the control signal generated from the first transition of the clock signal, forms a first operating cycle, such as a read cycle, while a sequence of operations by the first, second and fourth circuits, which are sequentially activated in accordance with the control signal generated from the second transition of the clock signal, forms a second operating cycle (write cycle). The fifth circuit performs control so that the first and second operating cycles are carried out alternately (see FIG. 17). The sixth circuit (such as an address clock generating circuit or a read and write pulse generating circuit of FIG. 2) performs timing control of the third and second control signals so that the third circuit in the first operating cycle and the first circuit in the second operating cycle will be carried out in parallel, A semiconductor device according to another embodiment of the present invention, based on the similar principle, comprises first to fifth circuits described as follows. The first circuit (such as a word driver for a word line selection in an X-selection circuit of FIG. 2) is activated for a predetermined preset period when one of a first control signal generated based on a first transition of an input clock signal and a second control signal generated based on a second transition of a cycle next following the first transition of the clock signal is activated. The second circuit (such as a word line driving circuit and a sense amplifier in the X-selection circuit of FIG. 2) is activated for a predetermined preset period when a third signal generated based on the first transition of the clock signal is activated, and operating responsive to an output result of the first circuit. A third circuit (such as a word line driving circuit by the X selection circuit of FIG. 2 and write amplifier WA of FIG. 2) is activated for a predetermined preset period when a fourth signal generated based on the second transition of the clock signal is activated, and operating responsive to an output result of the first circuit. A sequence of operations by the first and second circuits, which are sequentially activated in accordance with the control signal generated from the first transition of the clock signal, forms a first operating cycle, while a sequence of operations by the first and third circuits, which are sequentially activated in accordance with the control signal generated from the second transition of the clock signal, forms a second operating cycle. The forth circuit performs control so that the first and second operating cycles are carried out alternately (see FIG. 17). The fifth circuit (such as address clock generator 105, read pulse generator 106 and the write pulse generator 107 of FIG. 2) performs timing control of the control signals relevant to the activation of the second circuit in the first operating cycle and to the activation of the first circuit in the second operating cycle so that a portion of the operation of the second circuit in the first operating cycle and the operation of the first circuit in the second operating cycle are temporally overlapped with each other.

Figure 2:
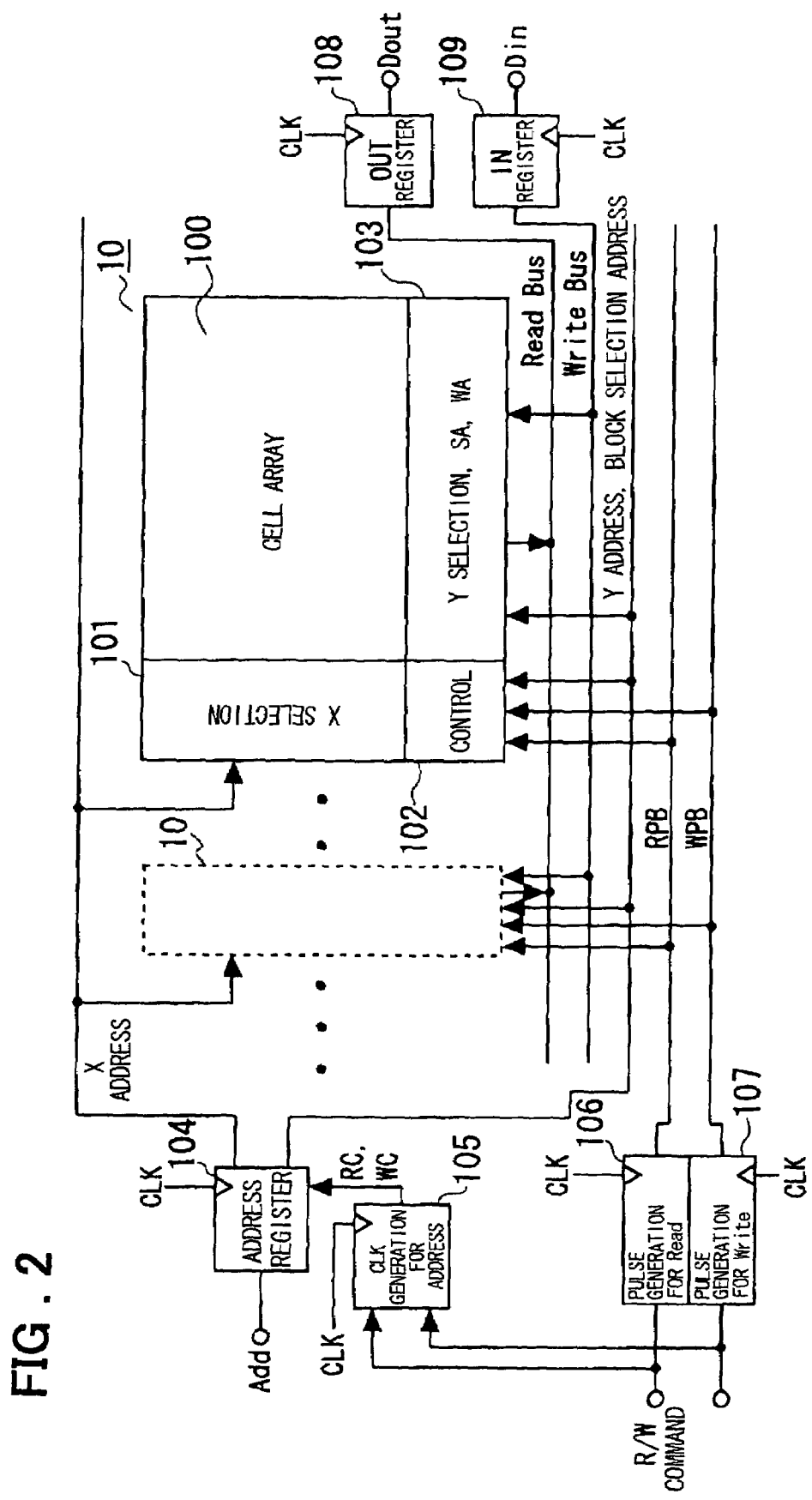
FIG. 2 shows an exemplary structure of a semiconductor storage device according to an embodiment of the present invention.

Referring to FIG. 2, a semiconductor memory device according to a preferred embodiment of the present invention includes a memory cell array 100 which has a plurality of memory cells, an address register 104, an address clock generator 105, a read pulse generator 106, a write pulse generator 107, decoders 101 and 103 and a control circuit 102. The address clock generator 105 generates a read clock (RC) in accordance with an input read command, based on the first transition of the input clock signal, and a write clock (WC) in accordance with an input write command, based on the second transition of a cycle next following the first transition of the clock signal. The address register 104 samples an input address signal based on the clock signal, receives the read clock RC and the write clock WC, output from the address clock generator and outputs the sampled address signal when one of the read clock RC and the write clock WC is activated. The read pulse generator 106 generates a read pulse signal RPB based on the first transition of the clock signal. The write pulse generator 107 generates a write pulse signal WPB based on a second transition of the cycle next following the first transition of the clock signal. Decoders 101 and 103 receive and decode the address signal output from the address register 104.

In the semiconductor storage device according to another embodiment of the present invention, the control circuit 102 includes a circuit for receiving a read pulse signal RPB from a read pulse generating circuit, for example, to generate a one-shot read pulse signal ROS based on the read pulse signal RPB; a circuit receiving a write pulse signal WPB from the write pulse circuit to generate a one-shot write pulse signal WOS based on the write pulse signal WPB; and a circuit (101, see also FIG. 5C), receiving the one-shot read pulse signal ROS and the one-shot write pulse signal WOS, and activated a predetermined preset period in case one of the one-shot read pulse signal ROS and the one-shot write pulse signal WOS is activated, for activating the selected word line responsive to the output result of the decoder.

The control circuit 102 also includes a circuit for activating the sense enable signal SE in accordance with the input read command based on the first transition of the clock signal and a circuit for outputting a write amplifier (WA)

enabling signal in accordance with the input write command based on the second transition of the clock signal.

The semiconductor storage device according to an embodiment of the present invention includes a sense amplifier SA activated a predetermined preset period on activation of a sense enable signal SE to amplify the data read on a bit line connected to the selected cell to output the amplified data as read data, and a write amplifier activated a predetermined preset period when the write amplifier (WA) activation signal indicates activation to effect writing data in the selected cell.

In the semiconductor storage device according to an embodiment of the present invention, an address decoding operation by the decoder, a word line selecting operation activating the word line selected by the decoder, and a sense operation by the sense amplifier, sequentially activated by the control signal generated from the first transition of the input clock signal, form a read cycle while an address decoding operation by the decoder, a word line selecting operation by a circuit activating the word line selected by the decoder, and a write operation by the write amplifier, sequentially activated by the control signal generated from the second transition of the input clock signal, form a write cycle. In an embodiment of the semiconductor storage device according to the present invention, an input port for write data and an output port for read data are provided separately.

The semiconductor storage device according an embodiment of the present invention includes a circuit for performing control to effect the read cycle and the write cycle alternately (see FIG. 17), and a circuit for controlling the timing so that the sense operation by the sense amplifier in the read cycle and the address decoding operation by the decoder in the write cycle in a cycle next following the read cycle occur in parallel (105, 106, 107 in FIG. 2). This configuration is effective to raise the frequency of the driving clock signals.

In an embodiment of the semiconductor storage device of the present invention, an address decoding operation by the decoder (X-selection circuit 101, Y-selection circuit 103 etc.), a word line selecting operation by the circuit activating the selected word line and a sense operation by the sense amplifier, sequentially activated by the read clock and the pulse signal, generated from the first transition of the clock signal, form a read cycle, an address decoding operation by the decoder, a write operation by the write amplifier and a pre-charging operation by the pre-charging circuit, sequentially activated by the read clock and the pulse signal, generated from the second transition of the clock signals, a word line selecting operation by the circuit activating the selected word line, form a write cycle. The word line selecting operation is overlapped with the write operation. The read cycle and the write cycle are controlled so as to occur alternately. Also, timing control is made so that the sense operation by the sense amplifier in the read cycle and the address decode operation by the decoder in a cycle next following the read cycle occur in parallel, and so that the bit line charging operation by the pre-charging circuit in a write cycle and the address decoding operation by the decoder in a read cycle next following the write cycle will occur in parallel.

In a semiconductor storage according to an embodiment of the present invention, in case that a first time equal to a sum of a word line selection time period in the read cycle and the skew of timing corresponding to the change in an address signal output from the address register to the address decoder is longer than a second time corresponding to the sum of the word line selection time period in the write cycle and the time of the pre-charging, the write pulse signal (WPB) for generating the write clock (WC) and the write one-shot pulse signal (WOS) is further delayed by (the first time–the second rime)/2.

In a semiconductor storage device according to an embodiment of the present invention, in case that a first time equal to a sum of a word line selection time period in the read cycle and the skew of timing corresponding to the change in an address signal output from the address register to the address decoder is shorter than a second time corresponding to the sum of the word line selection time period in the write cycle and the time of the pre-charging, the read pulse signal (RPB) for generating the read clock (RC) and the read one-shot pulse signal (ROS) is further delayed by (the second time–the first rime)/2.

From the above-described embodiment, there is also provided a semiconductor device which comprises a first circuit which is activated by a first control signal, generated based on the first transition of the input clock signal, to produce a first operation of a first period A, and a second circuit which is activated by a second control signal, generated based on the second transition of the input clock signal, next following the first transition, to produce a first operation of a second period B, with the first and second operations occurring cyclically alternately. In case of A>B, the period of the clock signal is (A+B)/2, and a delay equal to (A−B)/2 is added to the delay as from the second transition of the clock signal until start of the operation of the second circuit, whereby the clock period is speeded up from A up to (A+B)/2. In case of B>A, the clock signal period is set to (A+B)/2, and a delay of time (B−A)/2 is added to the delay as from the first transition of the clock signal until start of the operation of the first circuit.

In the semiconductor storage device according to another aspect of the present invention, a command composed of a read command and a write command, and an address signal, may be sampled by a rising edge and a falling edge of a pulse of the clock signal, in place of allowing the second transition of the clock signal to be the transition of the clock signal of a cycle next following the first transition, and the decoding in the cell array block as well as activation of the sense amplifier and the write amplifier may be generated using the rising edge of the clock signal.

In the semiconductor storage device according to another aspect of the present invention, an input terminal of the write amplifier is connected over a write bus to an output terminal of an input register which samples data supplied to a data input terminal in synchronism with the input clock signal to output the sampled data. An output terminal of the write amplifier is connected to a write data line. The bit line is connected over a write Y-switch to the write data line and the address signal is made up by an X-address for row selection, a Y-address for column selection and a block selection address for block selection for the memory cell array. The write amplifier is activated responsive to decoded results of the block selection address to output write data to the write data line, selection in the Y-switch is then made to transmit write data to the bit line connected to the write Y-switch which is turned on, and selection in the word line is then made to permit data to be written in the selected cell. It is noted that the number of bits of the address signals becomes larger in the order of the block selection, Y-address and the X-address, thus increasing the decoding time and skew. Thus, the write cycle may be speeded up by activating the operation in the decoding sequence.

EMBODIMENTS

The embodiments of the present invention will be described in detail with reference to the drawings. FIG. 1 depicts a schematic timing diagram for illustrating the operating principle of an embodiment of the present invention.

In FIG. 1, arrows of "Read" and "Write" indicate read and write cycles in a memory device, respectively. A waveform of the first row, indicated by a solid line, represents address decoding in the read cycle, word line selection in the memory cell array, address decoding in the write cycle, and word line selection. "SA(sense amp) activation" and "WA (write amplifier) activation" indicate a signal which controls the activation of the sense amplifier SA and a signal which controls the activation of the write amplifier WA, respectively. "Bit Line" designates the voltage waveform of bit line pair of the cell array. "Word Line selection" designates a period during which the word line is at a High level. During the decoding and the activation of the sense amplifier, the word line is in the non-selected (non-activation) state and, during the activation of the write amplifier, when the data is written in the selected cell, the word line is in the selected state.

The read cycle is comprised of the decoding of the read address, selection of the word line and the cell, and activation of the sense amplifier, while the write cycle is comprised of the decoding of the write address, selection of the word line, activation of the write amplifier and pre-charging of the bit line.

The bit line pre-charging following the activation of the write amplifier during the write cycle is carried out for pre-charging the bit line in readiness for the next read cycle.

As may be seen from FIG. 1, the activation of the sense amplifier of the read cycle is temporally overlapped with the address decoding during the write cycle in the present embodiment. The period of each cycle is set so as to be shorter than the read cycle or the write cycle, whichever is longer, and so as to be longer than the read cycle or the write cycle, whichever is shorter.

FIG. 2 depicts an illustrative basic structure of the memory device on which the present invention is practiced. The basic configuration of the present invention is the same as the configuration explained in connection with the related art, and differs therefrom as to the manner of timing control of such as control signals for read and write control. That is, in the configuration explained in connection with the related art, neither the sense amplifier activation during the read cycle nor the decoding overlap control is performed during the write cycle. The explanation of the schematics of the memory device shown in FIG. 2 has already been made in connection with the related art and is omitted here for avoiding redundancy.

In the present embodiment, the read cycle and the write cycle are executed alternately in the cell array block 10. That is, during the read cycle, next to the decoding period when the X address, the Y address and the block selection address are decoded by the X selection circuit 101, the Y selection circuit and by the control circuit 102 during the read cycle, a selected word line is activated by a word driver (a driver driving the word line, also termed an X driver), to select a cell. The word line then is set to the non-selected state and the sense amplifier SA is activated.

The activated sense amplifier SA amplifies a differential voltage ΔV (approximately 100 mV or less), presented on the bit line pair connected to the selected cell, to output a signal of a logic value corresponding to the read data on a read bus (Read Bus).

In the present embodiment, the sense amplifier activation period during the read cycle and the address decoding period during the write cycle are overlapped on a time axis, such that write address signals are decoded during the time of activation of the sense amplifier SA during the read cycle. That is, the read cycle and the write cycle are partially overlapped to allow increase in the rate of a clock signal which prescribes a period of a cycle.

In the present embodiment, the period of the read cycle is set so as to be equal to that of the write cycle.

In the cell array block 10, cell selection is made following the decoding period of the write cycle. Simultaneously, the write amplifier WA is activated, and the bit line pair, which is connected to the selected cell, is driven by the write amplifier with a voltage corresponding to the write data.

In the present embodiment, the signal amplitude on the bit line is reduced (the differential voltage ΔV of the bit line pair during read is usually 100 mV or less on the line Bit of FIG. 1), such that there is no necessity of providing a pre-charge period on the bit line after reading. It is because the amplitude of the signal to be written during the next write cycle is large as compared to the differential voltage ΔV appearing on the bit line pair and hence the write operation on the bit line is possible even if no pre-charging is performed. That is, memory cell selection and write amplifier activation may be effected so that the write data on the bit line will be presented during the period when the bit line is to be pre-charged after the sense amplifier SA is activated to read the data.

The above-described timing control may be implemented so that the selection period of the read/write word line (word line selection) is varied in a programmable way.

An address register 104 outputs a sampled address signal (read address) based on a read clock RC of a one-shot pulse which is output by an address clock generator 105 with the clock signal CLK as a trigger. The address decoding is carried out in the X selection circuit 101, which receives an address signal from an address register 104, a Y-selection circuit 103 and in a block selection address decoder not shown, provided in the control circuit 102. A word driver, not shown, in the X selection circuit 101, is activated by a control signal from the control circuit 102, as will be explained subsequently, to activate the word line selected by an X decoder, not shown, provided in the X selection circuit 101.

The sense amplifier SA is activated by activating the sense enable signal output from the control circuit 102 and supplied to a sense amplifier SA.

The address register 104 outputs an address signal (write address), sampled by a clock signal, based on a write clock signal WC output by the address clock generator 105, with a clock signal CLK as trigger. The address decoding is carried out in the X selection circuit 101, supplied with the address signal from the address register 104, the Y-selection circuit 103 and a block selection address decoder, not shown, in the control circuit 102. The write amplifier WA is activated by activating a write amplifier (WA) activation signal, not shown, output by the control circuit 102 and supplied to the write amplifier WA.

Figure 3A:
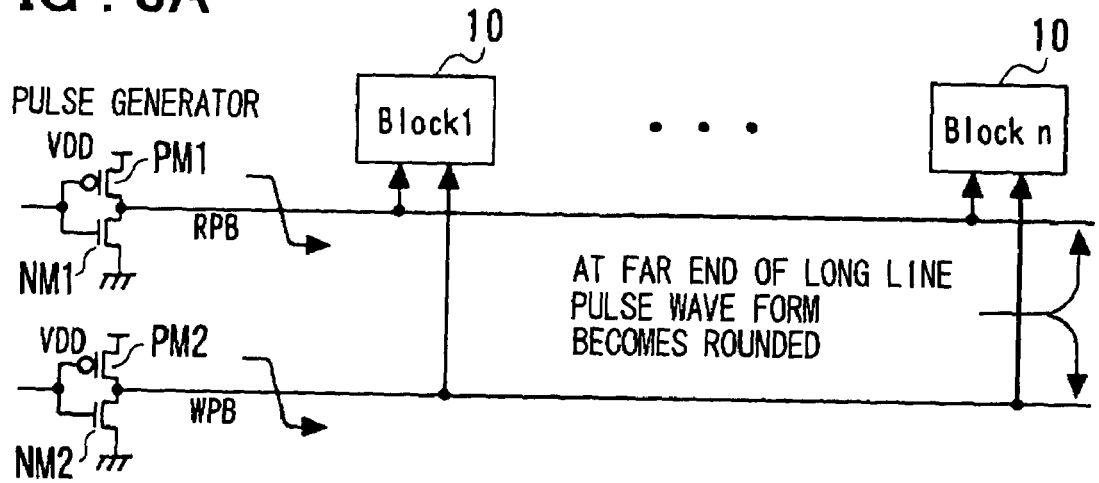
FIG. 3A shows an exemplary structure of a pulse generating circuit shown in FIG. 1, FIG. 3B schematically shows the pulse waveform in the alternate read/write operation and FIG. 3C schematically shows the pulse waveform in case the read cycles occur in succession.

FIG. 3A shows the structure of an outputting circuit of a read pulse generator 106 and a write pulse generator 107.

An output circuit of the read pulse generator 106 is composed by a CMOS inverter which is made up by a PMOS transistor PM1 and an NMOS transistor NM1, connected across a high voltage power supply VDD and a low voltage power supply VSS or GND, with the gates of the transistors being connected in common to an input terminal of an output circuit and with the drains thereof being connected in common to an output terminal of the output circuit. An output circuit of the write pulse generator 107 is similarly is composed by a CMOS inverter made up by a PMOS transistor PM2 and an NMOS transistor NM2.

In a cell array block 10 (Block 1 to Block n), where n is a preset positive integer not less than 1, falling edges are used for a read control pulse RPB and a write control pulse WPB. The reason is that the current driving ability of the NMOS transistor is higher than that of the PMOS transistor for the same transistor size (or the W/L ratio), that is that the output terminal voltage falls from the high voltage power supply VDD to the low voltage power supply VSS, by the NMOS transistor being turned on to discharge the output terminal of the CMOS inverter, in a shorter time than the time during which the PMOS transistor is turned on to charge the output terminal of the CMOS inverter to the high voltage power supply VDD, with the output terminal voltage rising from the low voltage power supply VSS to the high voltage power supply VDD. For the same reason, the falling edge is used for the write control pulse WPB.

Figure 3B:
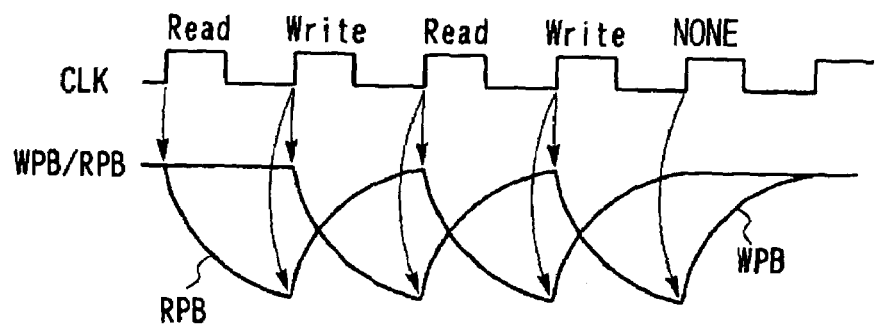

Meanwhile, in the structure shown in FIGS. 2 and 3A, in which the signal wiring for the read control pulse RPB is provided separately from that for the write control pulse WPB, and the signal interconnection for the pulse RPB is longer in length, the falling waveform of the pulse becomes rounded (dull) at a far end of the signal interconnection. If the read cycle and the write cycle are alternately repeated based on the clock signal, the periods of the respective pulses RPB and WPB are each a two-clock period (2tCLK). Thus, the pulses RPB and WPB are supplied at the same timing to the respective cell array blocks 10 at the far and near ends of the signal wirings, as shown in FIG. 3B. That is, the pulse RPB, which falls to a low level during the read cycle, rises to the power supply voltage level within the next write cycle, such that the pulse RPB is set to the high voltage power supply VDD within the read cycle next following the write cycle.

Figure 3C:
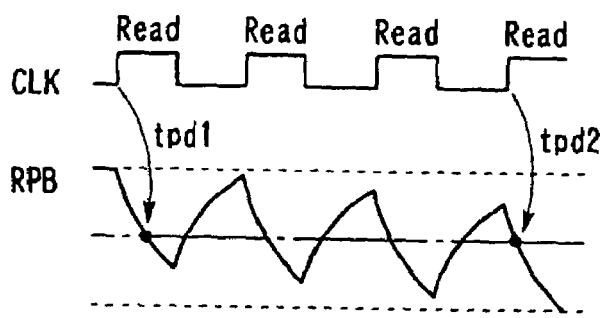
Figure 4A:
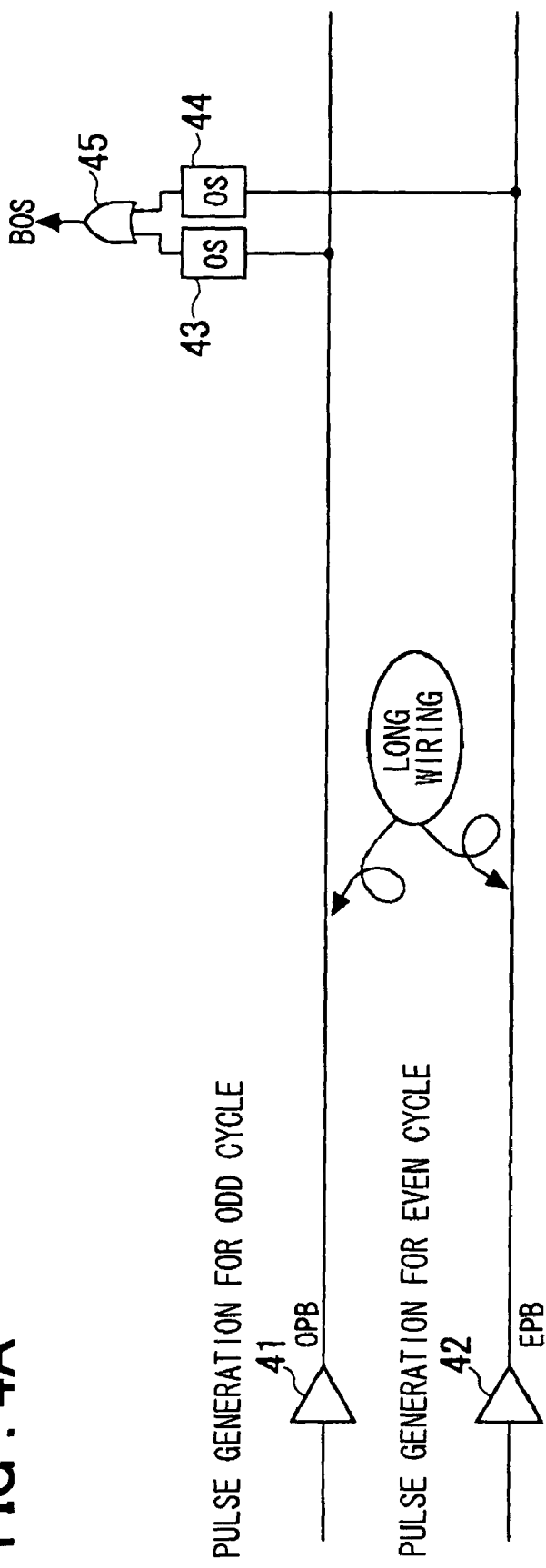
FIG. 4 shows the structure for coping with the blunting of the pulse waveform in case read cycles occur in succession.
Figure 4B:
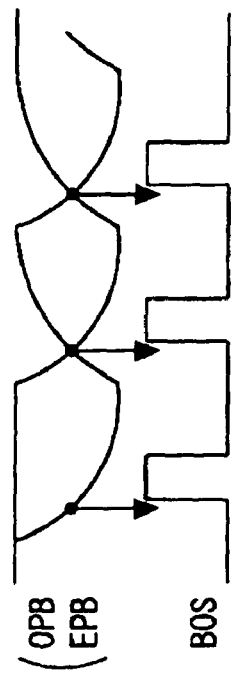

On the other hand, if the read cycles occur in succession, full swing of the pulses RPB cannot be achieved at the far end of the interconnection of the signal RPB, such that a difference is produced in the delay time from the clock rising edge to the fall of the pulse RPB, each cycle of the continuous operation, as shown in FIG. 3C, thus possibly producing a malfunction. In this case, a pulse generator for an odd cycle 41, which generates a pulse in an odd cycle, and a pulse generator for an even cycle 42, which generates a pulse in an even cycle, may be provided. The pulse generator for an odd cycle 41 and the pulse generator for an even cycle 42 deliver pulses of odd cycles and pulses of even cycles on separate signal lines, respectively. The cell array blocks receive pulses of odd cycles and pulses of even cycles by receivers 43 and 44, respectively and an OR circuit 45 takes the logical OR of the outputs of the receivers 43 and 44 to output a resulting signal as a basic pulse signal in the cell array block ("BOS"). By so doing, one-shot basic pulse signal ("BOS") may be supplied to the cell array block 10 at the same timing even in cases where the read cycles occur in succession. Of course, a similar structure may be used when the write cycles occur in succession.

The generation of control pulse signals in the cell array block 10 in an embodiment of the present invention, shown in FIG. 2, is hereinafter explained.

Figure 5A:
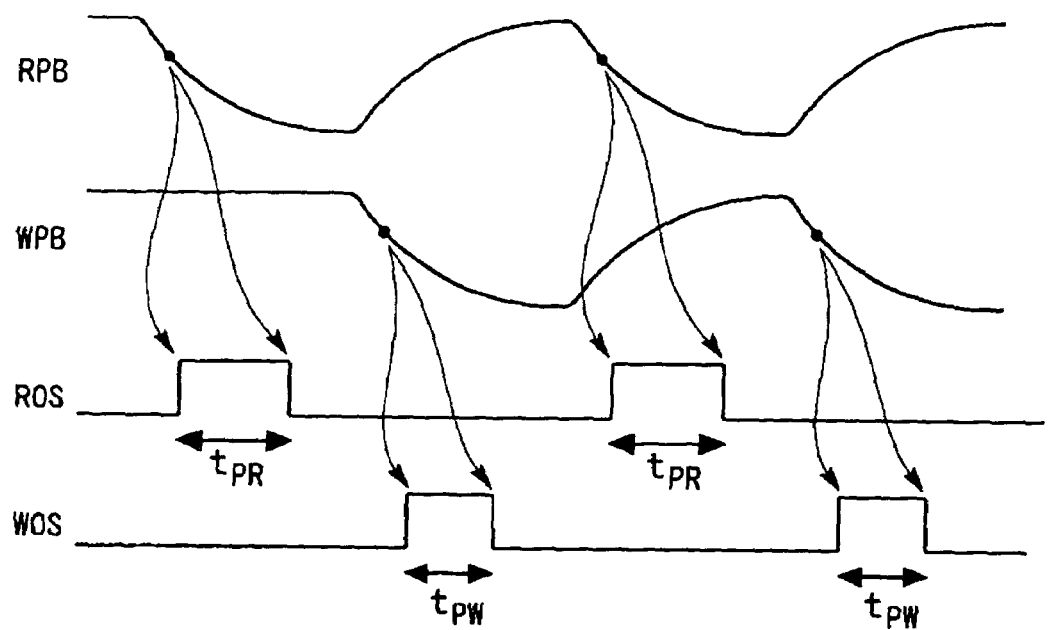
FIGS. 5A to 5C illustrate basic pulse generation in the cell array block in the embodiment of the present invention, FIGS. 5A and 5B depicting timing diagrams and FIG. 5C illustrating a word line selection circuit.

FIG. 5A shows the timing waveform for the control signals RPB, WPB, ROS and WOS in accordance with an embodiment of the present invention. The control signals RPB and WPB are output from the read pulse generator 106 and the write pulse generator 107, respectively, as explained with reference to FIGS. 2 and 3A, so as to be input to the control circuit 102.

The control circuit 102 in the cell array block 10 generates a one-shot ROS pulse, with a pulse width of tPR, as a word line activation controlling signal, from a falling edge of the read controlling pulse RPB, as shown in FIG. 5A. Moreover, the control circuit 102 generates a one-shot WOS pulse, with a pulse width of tWR, as a word line activation controlling signal, from a falling edge of the write controlling pulse WPB. The word pulse width, that is a period during which the word line is at a High level, is determined on the basis of the pulses generated.

In the read cycle, the activation period of the word driver which drives a word line selected by the X decoder (word line selecting period) is set, based on the ROS pulse output from the control circuit 102 to the selection circuit 101. In the write cycle, the word line activation time period (word line selecting time period) is set, based on the WOS pulse.

A pulse width tPR is the word pulse width which is the necessary minimum width during read, while a pulse width tPW is the word pulse width which is the necessary minimum width during writing. In general, tPR>tPW.

Figure 5B:
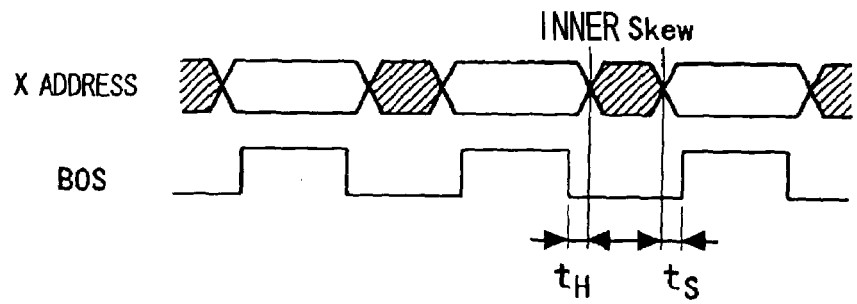
Figure 5C:
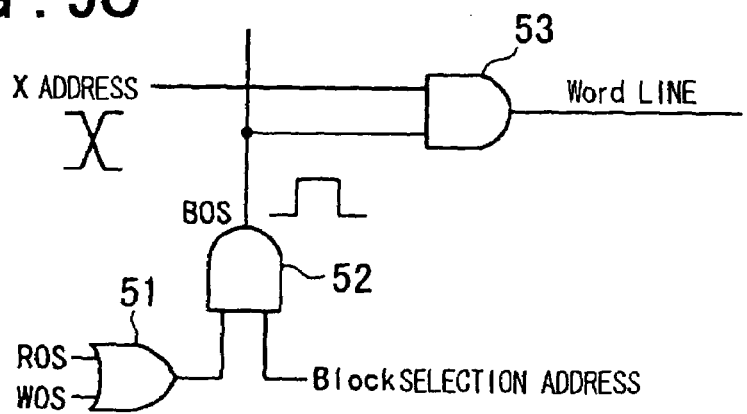

FIG. 5C illustrates a circuit structure of the control circuit 102 and the X selection circuit 101 (word driver). Referring to FIG. 5C, an OR circuit 51 receives as inputs pulse signals ROS and WOS, and an AND circuit 52 receives an output of the OR circuit 51 and a block selection address. An output of the AND circuit 52 is used as a basic pulse signal in the cell array block BOS. The word line selected by the decoded results of the X-address is driven by a word driver 53 during the time period of activation of the basic pulse signal in the cell array block BOS.

Referring to FIG. 5B, preset time margins (tH, tS) are provided for the skew in the change of the inner address (inner skew) before the rise time and after the fall time of the pulse of the basic pulse signal in the cell array block BOS. The cell remains selected during the time when the basic pulse signal in the cell array block BOS is activated (is at a HIGH level). The inner address is changed during the time the basic pulse signal in the cell array block BOS remains inactivated. For example, the inner skew of the changes in the X address (skew of the timing in the changes of the X address supplied from the address register to the X decoder) is made to be in a range as from tH since the fall of the basic pulse signal in the cell array block BOS until ahead of tS before the rise timing of the basic pulse signal in the cell array block BOS.

Figure 6:
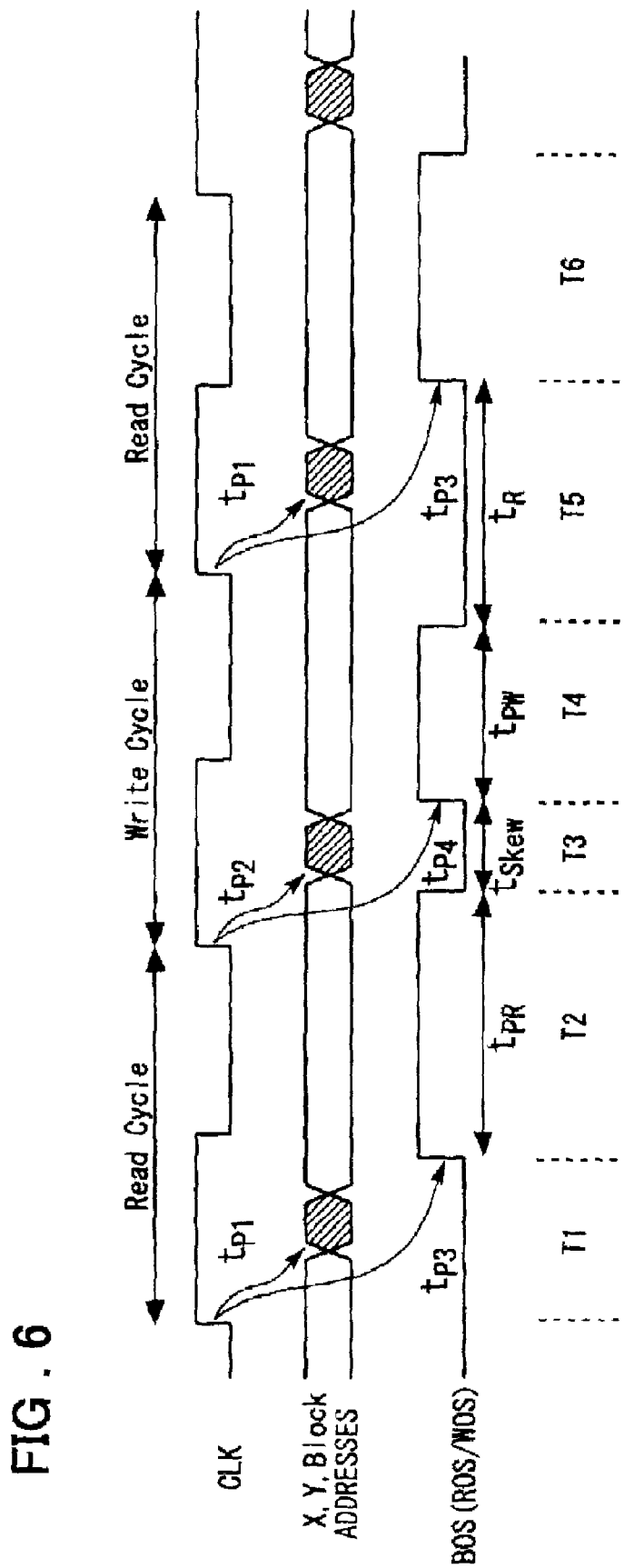
FIG. 6 is a timing diagram for illustrating the timing operation in the embodiment of the present invention.

In the present embodiment, the clock period may be reduced to the allowable limit. This point is one of the features of the present invention, and is hereinafter explained with reference to a timing diagram of FIG. 6. FIG. 6 depicts the timing diagram showing typical details of FIG. 1 which is a timing diagram for illustrating the principle of the present invention.

The pulse signal RPB, output from the read pulse generator 106, falls, based on the rising edge of the clock signal CLK, and a one-shot pulse ROS is generated, based on this pulse signal RPB. The word line driver is activated, and the selected word line is made to be at a High level. The time period of word line selection (pulse width tPR) is prescribed by the pulse width of the one-shot ROS.

In FIG. 6, the delay time as from the rising edge of the clock signals CLK until the change point of the inner address (X address, Y address and the Block address) is tp1.

The delay time as from the rising edge of the clock signal CLK until the rise of the basic pulse signal in the cell array block BOS, and hence until the rise of the word line, is tp3.

The hatched portions of the signal waveforms of the X, Y and Block addresses represent skews of the inner address change (inner skew). That is, a delay as from the rising edge of the clock signal CLK until the change of the inner address corresponds to the skew ranging from the left end to the right end of the hatched portion of the waveform of the address signal.

It is noted that tSkew after the fall of the one-shot pulse ROS (with a pulse width of tPR), that is after the fall of the word line, corresponds to the inner skew of the address change (hatched portion of the address), specifically, to a Low level period of the basic pulse signal in the cell array block BOS which secures the preset timing margin (tH, tS) for the inner skew in the address changes (see FIG. 5B).

In the next write cycle, the signal RPB is generated from the write pulse generator 107, based on the rising edge of the clock signal CLK, and the one-shot pulse WOS is generated, with the selecting word line being at a HIGH level. The pulse width tPW of the word line is determined by the pulse width of the one-shot pulse WOS. In the write cycle, the delay time as from the rise edge of the clock signal CLK until the change point of the inner address is tp2, while the delay time as from the rising edge of the clock signal CLK until the rise of the basic pulse signal in the cell array block BOS, and hence until the rising of the word line, is tp4.

In FIG. 6, tR after the fall of the one-shot pulse WOS (with the pulse width of tPW), that is after the fall of the word line in the write cycle, is the pre-charging time period of the bit line.

In FIG. 6, changes in the inner addresses (X address, Y address and the Block address), that is the result of the decoding, are obtained with a delay tp1 after the rising edge of the clock signal CLK. The word line is selected during the period of tPR, after the delay of tp3 as from the rising edge of the clock signal CLK. After the word line is set to the non-selected state (after the word line falls to a Low level), the sense amplifier is activated. This sequence of operations is the read cycle.

During this read cycle, the clock signal CLK of the next cycle rises with temporal overlap with the time period (tPR) when the word line is set to a High level for read of the cell data and, with a delay of tp2 as from the rising transition of the clock signal, changes in the inner address by the result of decoding of the write address are produced. That is, the sense period during which data of the selected cell transferred to the bit line, is amplified by the sense amplifier connected to the bit line and the amplified data is output, is overlapped with the write address decoding time period. This point represents one of the features of the present invention.

With the delay tp4 as from the rising edge of the clock signal of the write cycle, the word line is selected and, within the time period of selection of the word line (tpW), writing is made from the write amplifier to the selected cell.

The word line then is set to the non-selected state to execute pre-charging subsequent to data writing. A pre-charging circuit, including a switch connected across the bit line and the power supply (and an equalizer circuit connected across bit line pairs), are activated to pre-charge the bit line.

In the embodiment shown in FIG. 6, the pre-charging period tR in the write cycle is temporally overlapped with the start time point of the read cycle, which is the next cycle, while the pre-charging operation in the write cycle is carried out with a temporal overlap with the read address decoding operation. This point is another feature of the present invention.

That is, at least the trailing end side operation of the read cycle and the leading end side operation of the write cycle, are executed with temporal overlap, that is;

(T1) address decoding in a given read cycle and the pre-charge of the bit line of the write cycle directly previous to the read cycle;

(T2) selection of a word line in the read cycle;

(T3) the activation time period of the sense amplifier in the read cycle and decoding the address of the next write cycle;

(T4) selection of the word line in the next write cycle and writing in the cell by activating the write amplifier;

(T5) pre-charging of the bit line in the write cycle and decoding the address of the next read cycle;

(T6) selection of the word line in the next read cycle;

and so forth, are executed in this order. It is noted that the periods such as T2, T3 . . . indicate the time periods of the operations of an asynchronous circuit the time periods (time duration) of which are prescribed by e.g. a one-shot pulse generated based on the rising edge of the clock signals CLK and the read command. These periods such as T2, T3 . . . are not prescribed with the clocks as trigger. That is, the present invention differs from the clock synchronizing type pipeline control, as will be explained in detail subsequently.

As may be seen from FIG. 6, the following relationship is valid:

$$\text{Read cycle+write cycle} = tPR + tSKEW + tPW + tR \quad (1).$$

(A) In case of tPR+tSKEW=tPW+tR, we have the following equations:

$$tp1=tp2, tp3=tp4.$$

The operation is fastest and with the read and the write being of the same timing.

(B) In case of tPR+tSKEW>tPW+tR, a delay equal to $\{(tPR+tSKEW)-(tPW+tR)\}/2$ is further introduced in the path having a delay tp2 as from the rise of the clock signal until the change point of the write address and a delay of tp4 as from the rise of the clock signal until the activation of the word line.

(C) In case of tPR+tSKEW<tPW+tR, a delay equal to $\{(tPW+tR)-(tPR+tSKEW)\}/2$ is further introduced in the path with a delay tp1 as from the rise of the clock signal until the change point of the read address and with a delay of tp3 as from the rise of the clock signal until the activation of the word line.

For further increasing the delay tp1 and tp2 as from the transition of the clock CLK until the change point of the inner address for read/write, it is sufficient to change the timings of the read clock RC and the write clock WC supplied to the address register 104 of FIG. 2

For further increasing the delay tp3 and tp4 as from the transition of the clock CLK until the rise of the pulses ROS and WOS, it is sufficient to put back the timing of the read control pulse RPB and the write control pulse WPB in the read pulse generator 106 and in the write pulse generator 107 of FIG. 2.

Thus, the path with the delay tp2 and the delay tp4 in the write cycle may be delayed by putting back the timing of the write clocks WC supplied to the address register 104 and by putting back the timing of WPB in the write pulse generator 107.

The path with the delay tp1 and the delay tp3 in the read cycle may be delayed by putting back the timing of the read clocks RC supplied to the address register 104 and by putting back the timing of RPB in the read pulse generator 106.

Figure 7A:
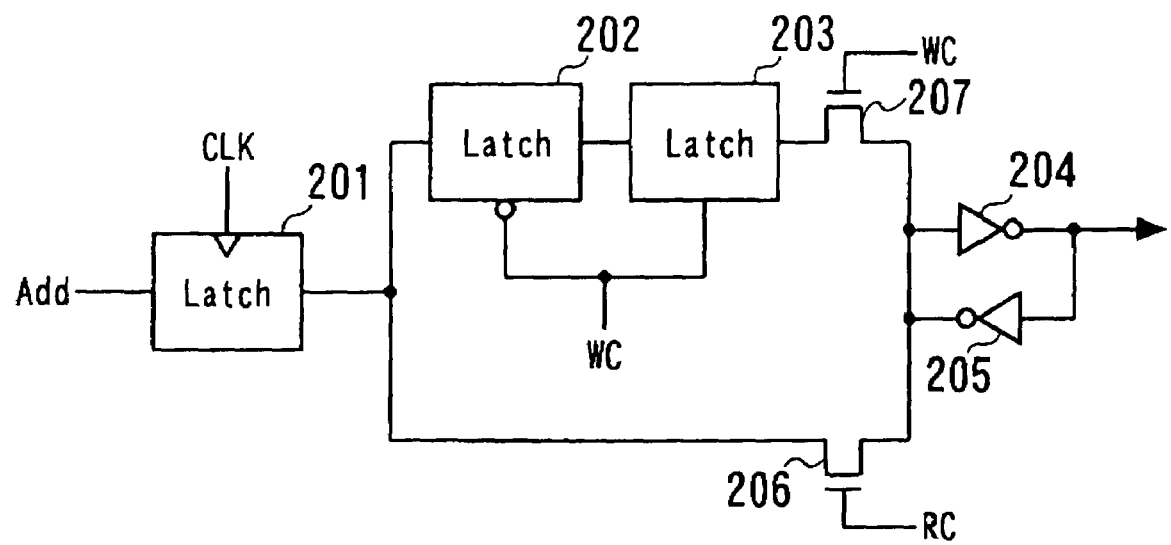
FIG. 7A shows a circuit for delaying tp1, tp2 in the embodiment of the present invention
Figure 7B:
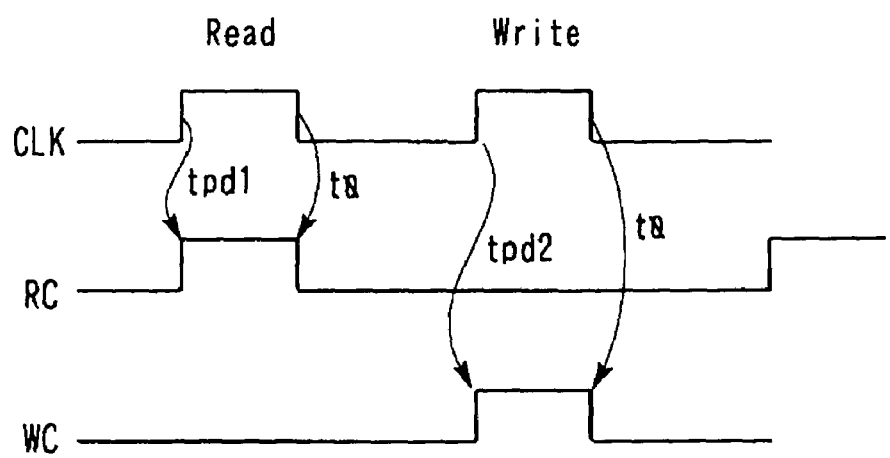
FIG. 7B depicts a timing diagram for illustrating the timing operation.

FIG. 7A shows the structure of the address register 104, and specifically shows the structure for further retarding the delay tp1 and tp2 of FIG. 6 using the read clocks RC and the write clocks WC. FIG. 7B shows the timing of the clock signal CLK, read clock RC and the write clock WC in FIG. 7A.

A first latch circuit 201 samples an address signal Add with a rising edge of the clock signals CLK. An output of the first latch circuit 201 is delivered via a path transistor 206 which is controlled on/off by the read clocks RC and an inverter 204. An output of the first latch circuit 201 is supplied to a second latch circuit 202, an output of which is supplied to a third latch circuit 203. The second latch circuit 202 samples the output of the first latch circuit 201 with a falling edge of the write clocks WC, while the third latch circuit 203 samples an output of the second latch circuit 202 with the rising edge of the write clocks WC. An output of the third latch circuit 203 is delivered via a path transistor 207 which is controlled on/off by the write clocks WC, and the inverter 204. The inverter 204 and the inverter 205 compose a flip-flop for storing the logic value of the directly previous output when the path transistors 206 and 207 are off. The second and third latch circuits 202 and 203 may not be needed in case the product is not of the late write type (such a product in which data writing in the cell occurs with a delay from the rising edge of the clock signal CLK).

As shown in FIG. 7B, if a delay tpd1 as from the rising edge of the clock signal CLK until the rise timing of the read clock RC in the address clock generator 105 is put back a necessary time duration, in the address register 104 of FIG. 7A, the delay time as from the rising edge of the clock signal CLK until the outputting of the address signal from the inverter 204 is increased and hence the timing of supplying the read address signal to the address decoder is put back and the delay (tp1 of FIG. 6) as from the rising edge of the clock CLK until the change in the inner addresses (X, Y and block selection addresses) is increased. Moreover, if a delay tpd2 as from the rising edge of the clock signals CLK until the rise timing of the write clocks WC in the address clock generator 105 is put back a necessary time duration, in the address register 104 of FIG. 7A, the delay time as from the rising edge of the clock signal CLK until the outputting of the address signal from the inverter 204 is increased and hence the timing of supplying the read address signal to the address decoder is put back and the delay (tp2 of FIG. 6) as from the rising edge of the clocks CLK until the change in the inner addresses (X, Y and block selection addresses) is increased. Meanwhile, in the address clock generator 105, the falling edge of the clock signal CLK is not used in the timing control.

Figure 8:
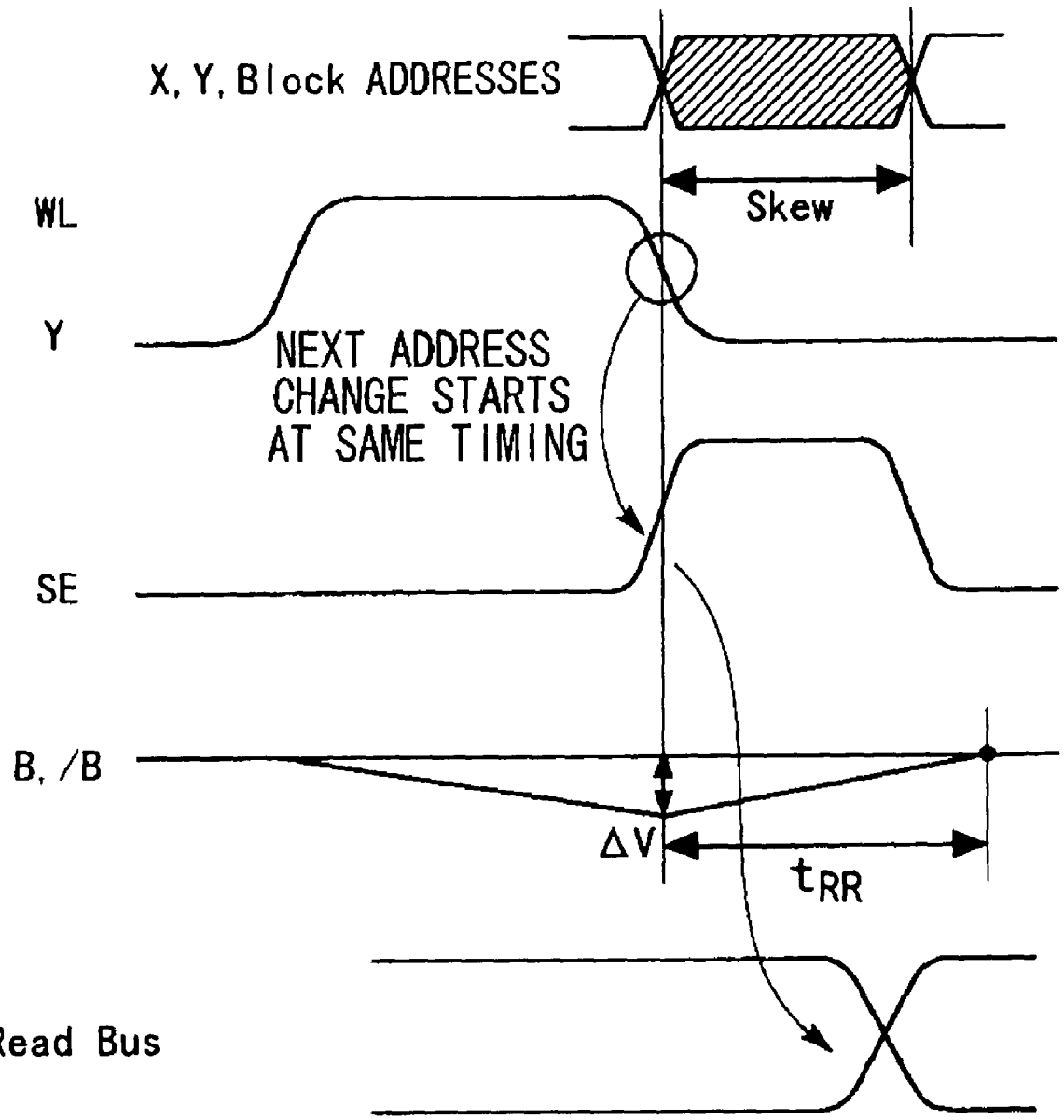
FIG. 8 is a timing waveform diagram for illustrating the read operation within the cell array block in the embodiment of the present invention.
Figure 9:
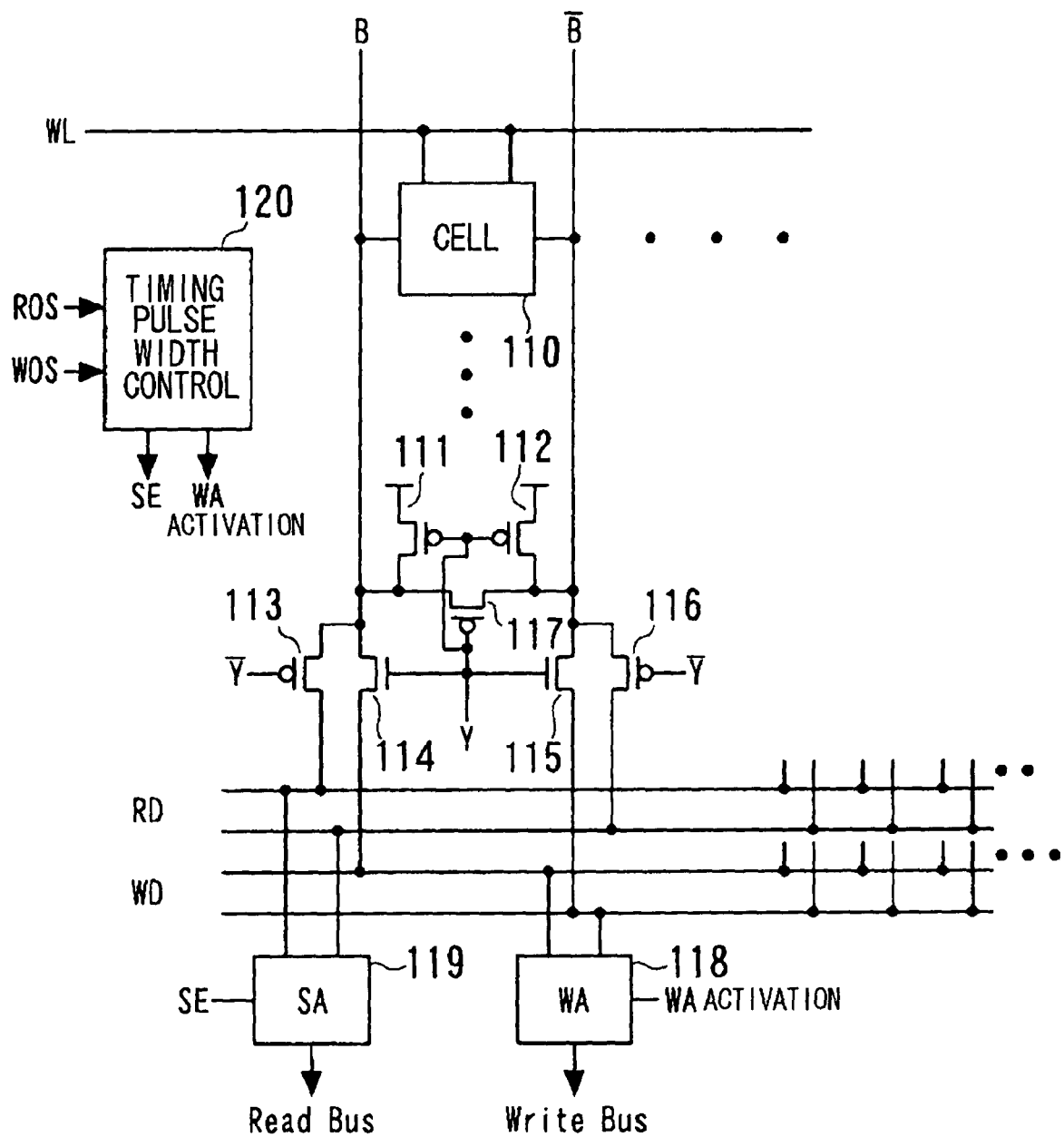
FIG. 9 shows a circuit of a bit line system within a cell array block in the embodiment of the present invention.

Referring to FIGS. 8 and 9, the read operation of the array block of an embodiment of the present invention is explained. FIG. 9 shows the circuit structure of the bit line system of the cell array block shown in FIG. 2.

Referring to FIG. 9, a cell 110 is connected to a bit line pair B, /B and to a word line WL. A PMOS transistor 117, which has its gate coupled to a Y selection signal, has a source terminal and a drain terminal connected across the bit lines B, /B, while two PMOS transistors 113 and 116, which have gates coupled to the Y selection signal, are connected across the source and drain terminals of the PMOS transistor 117 and the power supply VDD. The transistors 111, 112 and 117 pre-charge and equalize the bit line pair B and/B when the Y selection signal is at a LOW level (in the non-selected state). A Y-switch 113 is connected across the bit line pair B and read data (RD) line, and a Y switch 114 is connected across the bit line pair B and a word data (WD) line, whilst a Y-switch 116 is connected across the bit line/B and a complementary RD line, and a Y switch 115 is connected across the bit line pair/B and a complementary RD line. An output of the sense amplifier (SA) 119 is connected to a read bus, while an input of the write amplifier (WA) 118 is connected to a write bus. The read bus is connected to an output register (108 of FIG. 2) and the write bus is connected to an input register (109 of FIG. 2). A timing pulse width control circuit 120 is included in the control circuit 102 and receives one-shot pulse signals ROS and WOS, used for activating the read and write word lines (one-shot pulses generated from the RPB and WPB signals) to perform control to output a sense enable signal SE of a preset pulse width, based on the pulse signal ROS, for example, after the pulse signal fall to a Low level. The timing pulse width control circuit also performs control to adjust the timing and the pulse width of the write amplifier (WA) activation signal based on the pulse WOS. The sense amplifier 119 is activated by the input sense enable signal (SE), while the write amplifier 118 is activated by the input write amplifier (WA) activating signal.

Referring to FIG. 8, the word line WL and the Y-selection signal Y are set to a High level to select the cell. A difference voltage ΔV, corresponding to the data held by the selected memory cell, appears on the bit line pair B and/B.

The word line (WL) and the Y switch then fall to a Low level and the sense enable signal SE is activated (rises to a HIGH level).

At this time, a change is induced in the addresses of the next write cycle (X, Y and block selection addresses). The skew of the X, Y and block selection addresses, the range of which is indicated by double-headed arrow in FIG. 8, is the skew of the address change point (skew of the change point of the inner address supplied from the address register 104 to the X-Y-block selection address decoder of the cell array block).

In the present embodiment, the rise from a Low level to a High level of the sense enable signal SE and changes in the X-Y-block selection addresses occur simultaneously.

In FIG. 8, a sense period tRR, during which the sense enable signal, is at a HIGH level, is a recovery period of the bit line pair B and/B, and the voltage of the bit line pair (difference voltage ΔV) is set to the same voltage VCC. During the sense period, read data is read and output from the sense amplifier 119 (FIG. 9) to the read bus.

The amplitude of the bit line pair at the time of the read operation (difference voltage) ΔV is set to the smallest voltage which allows for the regular operation of the sense amplifier 119, such as to 100 mV or thereabouts, or less.

If the skew of the address of the next write cycle ends faster than the time tRR of recovery of the bit line pair to the difference voltage of 0V, selection of the next write cycle is commenced before tRR. It is because the cycle next to the read cycle is the write cycle and hence the write operation is possible even when the recovery of the bit line pair is insufficient. Meanwhile, when the read cycles occur in succession, and transition to the next read cycle is made without recovery to the difference voltage of 0V of the bit line pair, the read operation occurs as the difference voltage of the bit line pair persists as offset. It is for this reason that the recovery operation is performed in case the read cycles occur in succession.

Figure 10:
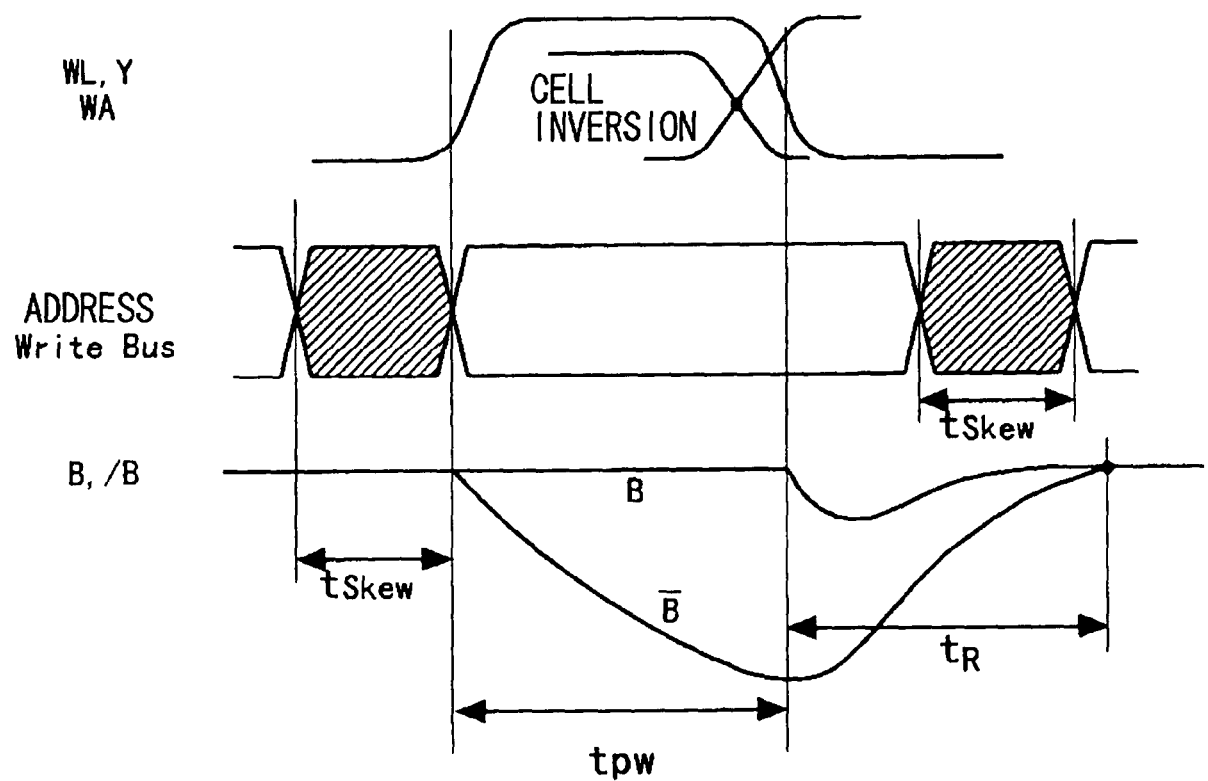
FIG. 10 is a timing diagram for illustrating the write operation in the cell array block in the embodiment of the present invention.

The write operation in the cell array block 10 in accordance with the present embodiment (see FIG. 2) is now explained. FIG. 10 is a timing diagram for illustrating the write operation in the cell block array of the present embodiment. In FIG. 10, WL and Y depict a word line and the Y selection signal (see FIG. 9), respectively, while WA depicts an activating signal for the write amplifier, and tSKEW (hatched portion) of signal waveforms of the address and the write bus depicts the skew in the changes in the write bus. The pulse width necessary for cell inversion is tpW, while the time for recovery to 0V of the difference voltage of the bit line pair is tR (pre-charge period). The pre-charging is required because the cycle next following the write cycle is the read cycle. Usually, tR>tSKEW.

Figure 11:
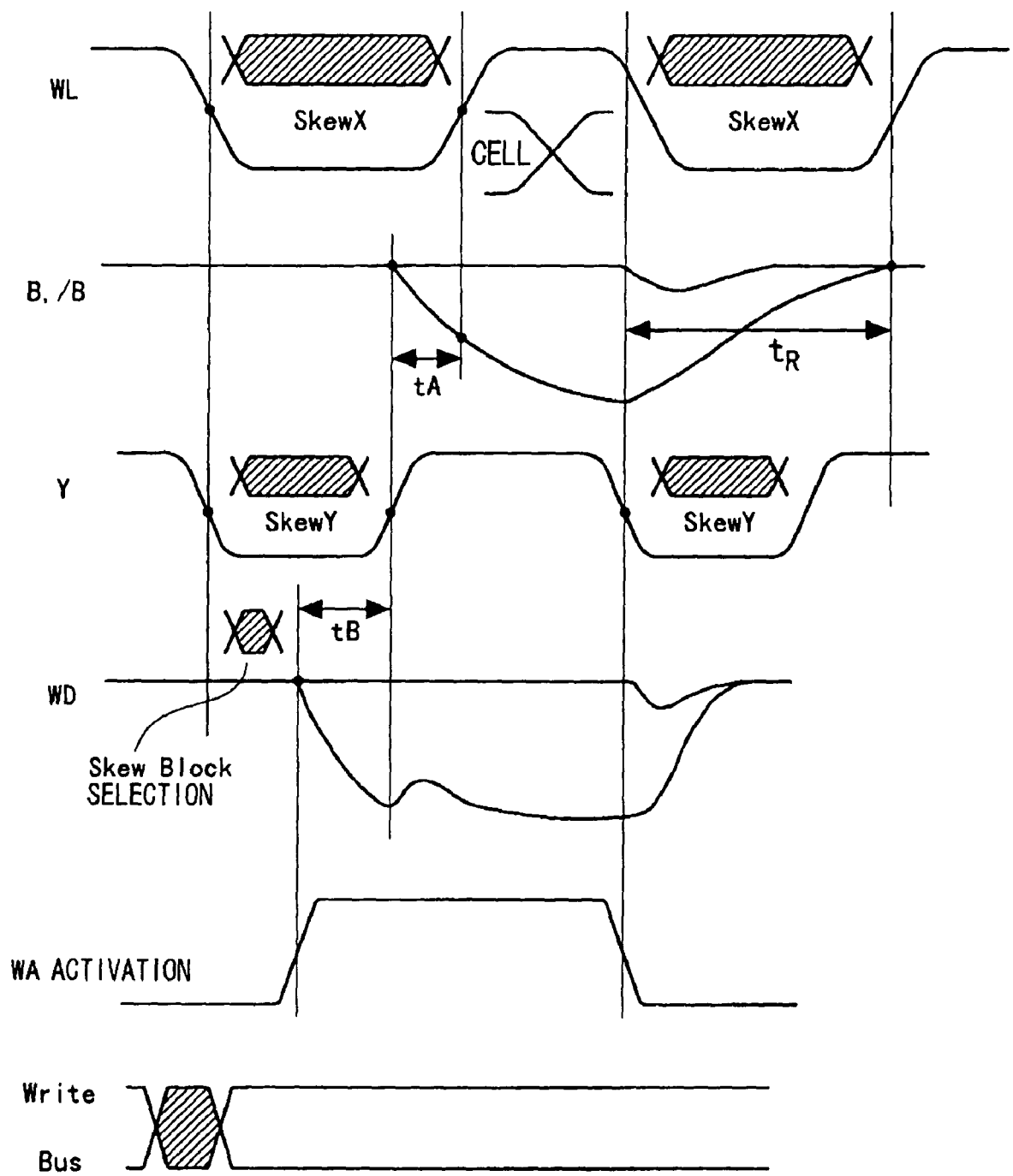
FIG. 11 is a timing waveform diagram for illustrating a technique in shortening the write operation in the embodiment of the present invention.

Referring to the timing diagram of FIG. 11, the technique of shortening the write cycle as a modification of the present invention is explained.

In FIG. 11,

WL is the waveform of the word line;

Y is the waveform of the Y selection signal (see FIG. 9);

WA indicates the state of activation of the write amplifier and depicts the waveform of a write enable signal supplied to the write amplifier;

WD is a voltage waveform of the write data line pair WD of FIG. 9;

Write Bus is a signal on a write bus of FIGS. 2 and 9;

SKEWX is the skew of changes in the X-address;

SKEWY is the skew of changes in the Y-address; and

SKEW BLOCK selection is the skew of changes in the block selection address.

The larger the bit width in the address signal, the larger becomes the number of stages of circuits in the decoder. Usually, the bit width of the X-based addresses is the largest, with the bit width of the address of the Y-based addresses and the bit width of the block-based addresses becoming smaller in this order.

In the present embodiment, the difference in the skew between the X-based, Y-based and block-based addresses is exploited to cause the activation of the write amplifier WA to occur temporally before the activation of the X address and the Y address for shortening the write cycle. First, the write amplifier WA, which receives the data of the write bus, is activated. The activated write amplifier (WA) outputs data to a complementary the write data line WD. After delay time tB, the Y selection signal goes to a HIGH level, Y-switches 114 and 115 which are connected to the complementary write data line WD, are turned on and a pair of bit lines B and/B are driven with write data from the write amplifier (WA). Since the cell inversion occurs quickly, the word line WL may be activated at a time point when the voltage on the bit line falls. In the embodiment shown in FIG. 1, the word line WL is activated at a time point when the delay time tA has elapsed since the Y-switches 114 and 115 are turned on (at a time point when the bit line voltage is decreased to a certain extent), and a cell is selected to effect writing in a cell 110 (cell inversion).

The write data line WD, write amplifier WA and the write bus operate only during the write cycle, and hence are irrelevant to the end of the directly previous cycle, such that the voltage of the write data line WD is lowered in advance. For this reason, the fall of the bit line pair B and/B occurs quickly.

In the present embodiment, described above, control is exercised to overlap the sense period of the read cycle with the address decode period of the write cycle. However, the operating principle is totally different from that of the pipelining system.

The read/write overlap system of the present embodiment is now explained with the conventional pipelining system as a Comparative Example.

Figure 12:
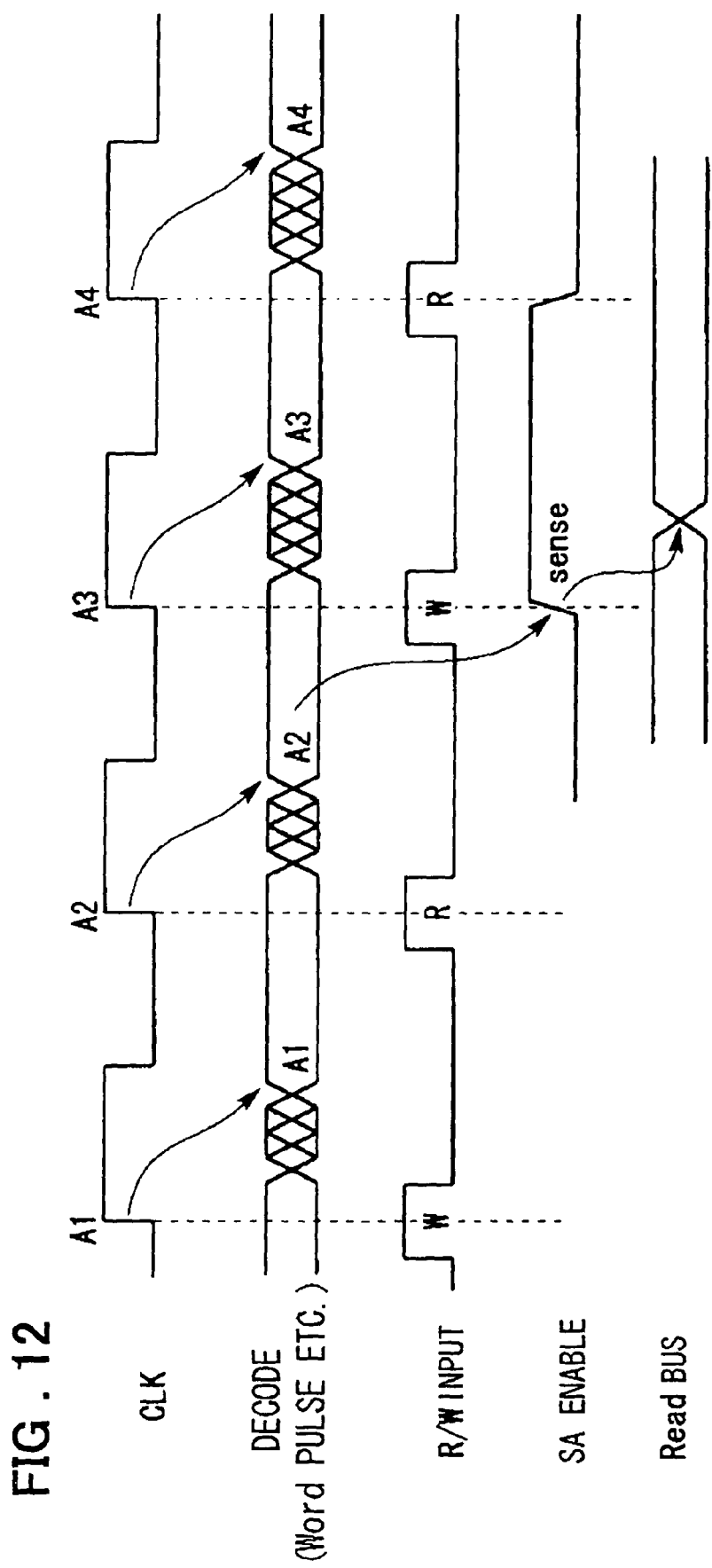
FIG. 12 is a timing waveform diagram for illustrating the operation of a pipelining architecture as a comparative example for the present invention.

In the usual pipelining system, if the sensing and outputting of the read data of the previous cycle A2 is to be performed as a parallel operation to decoding of an A3 address, control is exercised for activating the sense amplifier with the clock edge of A3 as a trigger, as shown in FIG. 12.

In the present embodiment, the sense amplifier (SA enable) is activated, with the edge of A2 of the read cycle as a trigger.

Figure 13:
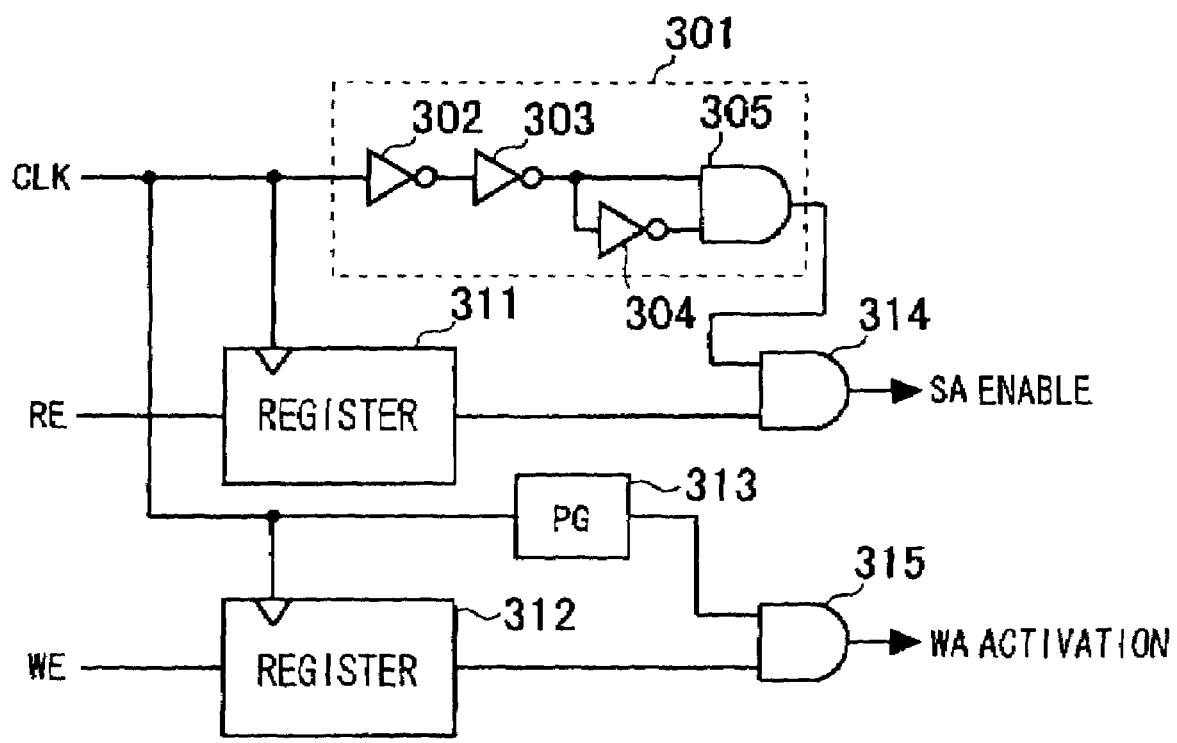
FIG. 13 shows a circuit for generating a signal for controlling the read/write activation of the present invention.

FIG. 13 shows the structure of an embodiment of a circuit for generating sense enable signals SE to be supplied to the sense amplifier. A read pulse generator 301 (corresponding to the read pulse generator 106 of FIG. 2) includes an inverter sequence made up by even numbered inverter stages, herein first and second inverters 302 and 303, for delaying the clock signal, a third inverter 304 for inverting the output of the inverter sequence, and an AND circuit 305 supplied with outputs of the second and third inverters 303, 304, and generates a one-shot read pulse RPB from the rising edge of the clock signal CLK. It should be noted that the read pulse RPB, output from the read pulse generator 301, is not determined by the falling edge of the clock signals CLK, as is the case with the read pulse RPB shown in FIG. 3B. That is, the read pulse RPB rises with a delay time of the first and second inverters 302 and 303 as from the rise of the clock signal CLK and is of a pulse width prescribed by the delay time of the third inverter 304. In the instance shown in FIG. 13, the command (R/W command) may be supplied to the control circuit 102 (see FIG. 2) of each cell array block to generate a sense enable signal and a write enable signal, with the read control pulse RPB and the write control pulse WPB being generated in the control circuit 102.

A first register 311 samples the read command RE (read enable) with the rising edge of the clock signal CLK. An AND circuit 314, receiving the output of the first register 311 and the RPB, outputs an SA enable signal, which is equivalent to the sense enable signal SE.

A write pulse generator 313 (corresponding to 107 of FIG. 2) is the same as the read pulse generator 301 and generates a one-shot write pulse signal WPB from the clock signal CLK. A second register 312 samples the write command WE (write enable) with the rising edge of the clock signal CLK. An AND circuit 315, receiving the output of a second register 312 and the signal WPB as inputs, outputs a WA activating signal.

Figure 14:
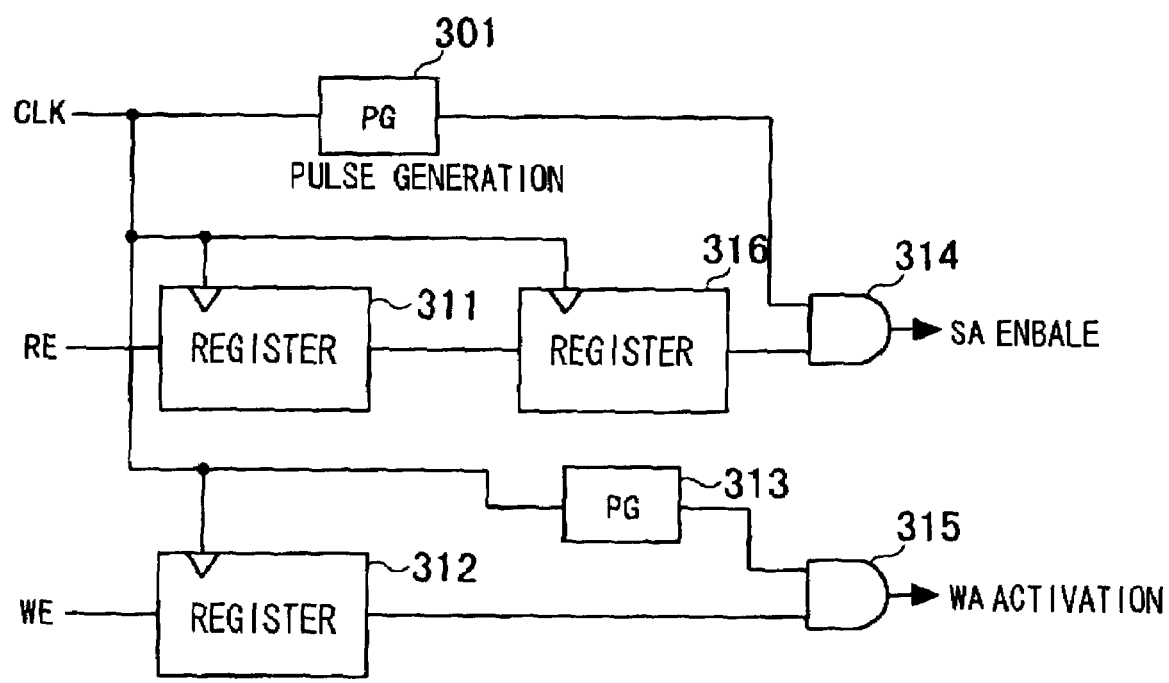
FIG. 14 shows a circuit for generating a signal controlling the read/write activation of a pipelining system as a comparative example.

FIG. 14 shows, as a Comparative Example, the structure of a circuit for generating the sense enable signal SE in accordance with the pipelining system. This circuit includes a read pulse generator 301 and two cascaded registers 311 and 316, and an AND of the output of the register 316 and the output of the read pulse generator 301 by an AND circuit 314 becomes an SA enable signal, which is equivalent to the sense enable signal SE. Thus, the timing control performed by the present invention differs from that of the pipelining system.

A modification of the present invention is hereinafter explained.

The present invention does not exploit pipeline based control system for overlapping the read/write. Thus, if the address or the command is sampled with one clock edge and the state is determined, the read/write can be effectuated in the inside independently of each other. So, the read/write can be executed with an overlap within one clock cycle. FIG. 15 depicts a timing diagram for illustrating the operation of a further modification of the present invention.

As shown in FIG. 15, both the rising and the fall of the clock signal CLK are used as a trigger. The address register 104 and the address clock generator 105 (see FIG. 2) sample the address signal and the read/write (RE/WE) command. In FIG. 15, the read command RE and the addresses A1 and A3 are sampled with the rising edge of the clock signal CLK, while the write command W and the address A2 are sampled with the falling edge of the clock signal CLK.

On the other hand, the decoding in the cell array block 10, activation of the sense amplifier SA and the activation of the write amplifier WA are performed using only the rising edge of the clock signal CLK.

Figure 16A:
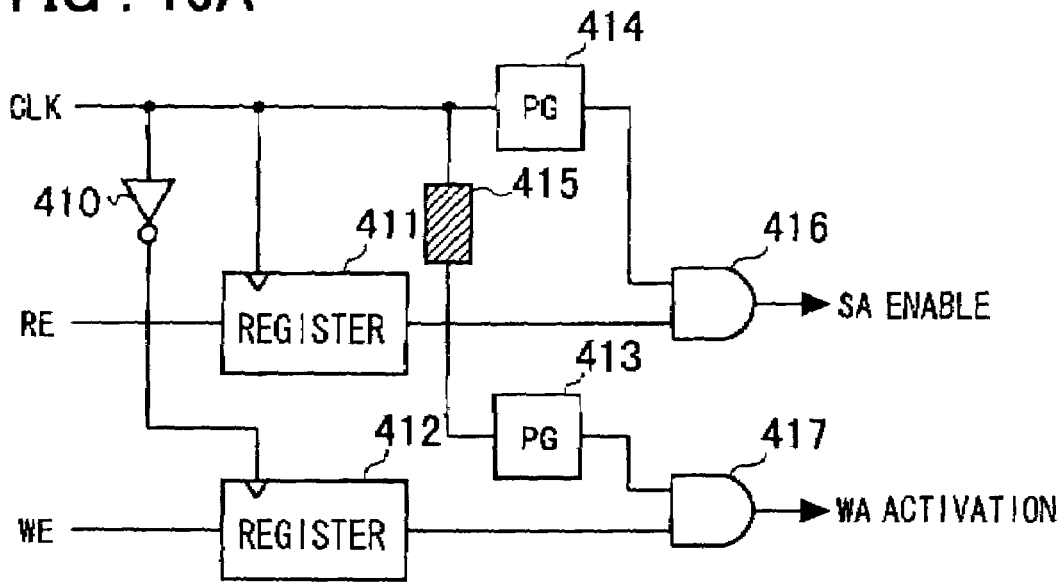
FIG. 16A shows a modification of the present invention.
Figure 16B:
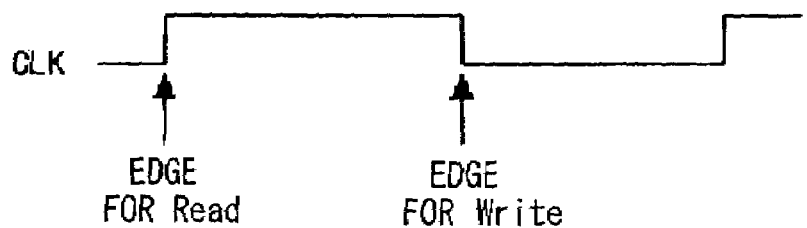
FIGS. 16B and 16C shows the clock waveform.

FIG. 16A shows an example of a circuit configuration which performs the timing operation shown in FIG. 15. This circuit is included in the control circuit 102 (see FIG. 2) and generates a sense amplifier enable signal and a write amplifier enable signal from one clock edge. The rising edge from LOW to HIGH of the clock signal CLK and the falling edge from HIGH to LOW of the clock signal CLK are used for read and write, respectively, as shown in FIG. 16B.

Referring to FIG. 16A, there are provided a first pulse generator 414 which receives a clock signal CLK as an input, a first register 41 which samples the read command RE with the rising of the clock signal CLK, a second register 412 which samples the write command E with the rising of the clock signal CLK, a delay circuit 415 which delays the clock signal CLK, a second pulse generating circuit 413 which receives an output signal of the delay circuit 415 to generate a pulse signal, a first AND circuit 416 which receives outputs of a first pulse generating circuit 414 and the first register 411 as inputs, and a second AND circuit 417 which receives outputs of a second pulse generating circuit 413 and the second register 412 as inputs. A sense enable signal and a write amplifier (WA) activating signal are output from the outputs of the first AND circuit 416 and the second AND circuit 417, respectively.

Figure 16C:
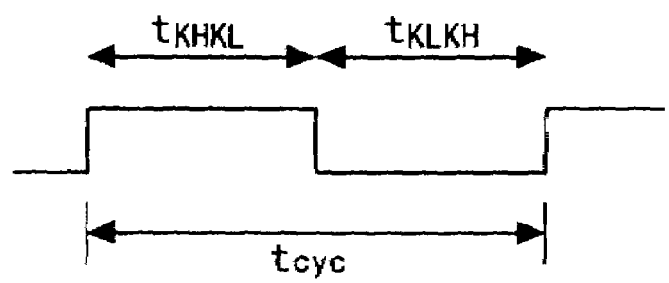

Referring to FIG. 16C, even though the period tcyc of the clock signal CLK is constant, a High level period and a Low level period tend to be deviated by e.g. duty errors and the like. Since the operating timing is determined using only the rising edge of the clock signal, the timing accuracy and stability are improved, so that the performance may be improved as compared to a structure of determining the timing using the clock rising edge and falling edge.

Figure 17:
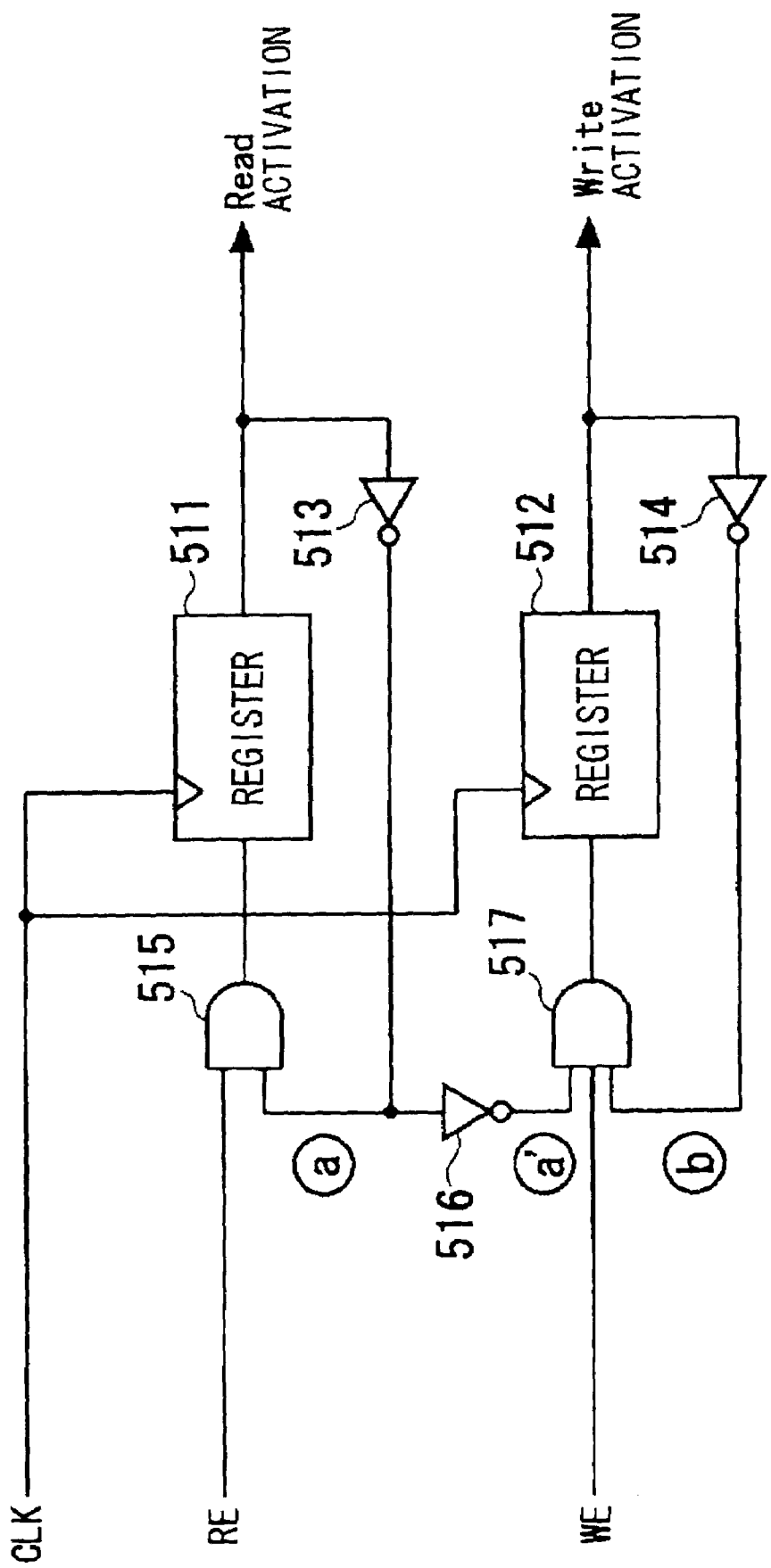
FIG. 17 shows a circuit for generating inner control pulse signals for implementing alternate read/write operations.

The generation of the inner control pulse by the alternate read/write cyclic operations is now explained. FIG. 17 shows an instance of the structure of the circuit for alternate generation of read/write control signals used e.g. for the address clock generator 105. Referring to FIG. 17, the circuit includes a two-input AND circuit 515 which receives a read command RE, a first register 511 which receives an output of the two-input AND circuit 515 and samples the output of the two-input AND circuit with the rising edge of the clock signal CLK, a first inverter 513 which inverts the output of the first register 511, and a second inverter 516 which receives the output of the first inverter 513 as an input. The output of the first inverter 513 is fed back to the two-input AND circuit 515. The circuit also includes a three-input AND circuit 517 which receives the write command WE, a second register 512 which receives the output of the three-input AND circuit 517 as an input and samples the output of the three-input AND circuit 517 with the rising edge of the clock signal CLK, and a third inverter 514 which inverts the output of the second register 512. The outputs of the second and third registers 516 and 514 are supplied to the three-input AND circuit 517 and a read activation signal and a write activation signal are output from output terminals of the first and second registers 511 and 512, respectively. Similarly to the output signals of the registers 311 and 312 of FIG. 13, the read activation signal and the write activation signal output from the first and second registers 511 and 512, respectively, may be supplied to two corresponding AND circuits (see 314 and 315 of FIG. 13), which output AND results thereof with the read control pulse and the write control pulse as sense amplifier (SA) enable signal and write amplifier (WA) activation signal, respectively.

During read activation, the AND circuit 515 takes an AND of the inverted data a of the value of the previous cycle (output of the first inverter 513) and the read command RE. An output of the AND 515 is captured by the first register 511 by the rising edge of the clock signal CLK, whereby the read is activated every other clock cycle.

During write activation, the AND circuit 517 takes an AND of the inverted data b of the value of the previous cycle (output of the third inverter 514), the write command WE and a read activation state a' of the previous cycle (output of the inverter 516). An output of the AND 517 is captured by the second register 512 by the rising edge of the clock signal CLK, whereby the write is activated every other clock cycle. Since the write decision is based on the read activated state a', the read/write is alternately activated with an offset of one cycle. Using output signals of the first and second registers 511, 512, the read and the write are activated, respectively.

The present invention may be conveniently applied to for example an SRAM in which the read cycle and the write cycle are executed alternately. However, the present invention may be applied to an SRAM of the DDR system in which, by having switching means for switching between timing control optimized when the read cycle is carried out in succession, timing control optimized when the write cycle is carried out in succession and timing control optimized when the read cycle and the write cycle are carried out alternately, the read cycle or the write cycle may be executed in succession. The present invention may be applied with advantage to the SDRAM of the I/O separate type QDR/DDR system. However, the present invention is, of course, not limited to the SRAM. Moreover, the timing control method according to the present invention may be applied not only to a semiconductor memory device, but also to a logical integrated circuit, having enclosed therein a memory device, and to an optional circuit in which the operational timing may be controlled by a one-shot pulse signal generated by the clock edge.

Although the present invention has been explained with reference to the embodiment illustrated, the present invention may, of course, comprise various modifications or corrections that may occur to those ordinarily skilled in the art within the scope of the invention defined in the appended claims.

The meritorious effects of the present invention are summarized as follows.

According to the present invention, described above, the operating frequency may further be improved by timing control for overlapping the sense operation of the read cycle and the decode period of the write operation.

Moreover, according to the present invention, the write cycle may be increased in speed by controlling the activation of the write amplifier, Y switch and the word line as the decoding time by the address bit width is taken into account.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
   a first circuit being activated for a first predetermined preset period when one of a first control signal generated based on a first transition of an input clock signal and a second control signal generated based on a second transition of said input clock signal of a cycle next following said first transition of said input clock signal is activated;
   a second circuit being activated for a second predetermined preset period when a third control signal generated based on said first transition of said input clock signal is activated, said second circuit operating responsive to an output result of said first circuit;
   a third circuit being activated for a third predetermined preset period when a fourth control signal generated based on said second transition of said input clock signal is activated, said third circuit operating responsive to an output result of said first circuit;
   a sequence of operations by said first and second circuits, sequentially activated in accordance with said third control signal generated from said first transition of said input clock signal, constituting a first operating cycle;
   a sequence of operations by said first and third circuits, sequentially activated in accordance with said fourth control signal generated from said second transition of said input clock signal, constituting a second operating cycle;
   a circuit for performing control so that said first operating cycle and said second operating cycle are carried out alternately; and
   a circuit for controlling timing of said third control signal relevant to activation of said second circuit in said first operating cycle and timing of said second control signal relevant to activation of said first circuit in said second operating cycle so that a portion of the operation of said second circuit in said first operating cycle is temporally overlapped with the operation of said first circuit in said second operating cycle.

2. A semiconductor device, comprising:
   a first circuit being activated for a first predetermined preset period when one of a first control signal generated based on a first transition of an input clock signal and a second control signal generated based on a second transition of said input clock signal of a cycle next following said first transition of said input clock signal is activated;
   a second circuit being activated for a second predetermined preset period when one of a third control signal generated based on said first transition of the input clock signal and a fourth control signal generated based on said second transition of said input clock signal is activated, said second circuit operating responsive to an output result of said first circuit;
   a third circuit being activated for a predetermined preset period when a fifth control signal generated based on said first transition of said input clock signal is activated, said third circuit operating responsive to a result of operation of said second circuit;
   a fourth circuit being activated for a fourth predetermined preset period when a sixth control signal generated based on said second transition of said input clock signal is activated;
   a sequence of operations by said first, second and third circuits, sequentially activated in accordance with said fifth control signal generated from said first transition of said input clock signal, constituting a first operating cycle;
   a sequence of operations by said first, second and fourth circuits, sequentially activated in accordance with said sixth control signal generated from said second transition of said input clock signal, constituting a second operating cycle;
   a circuit for performing control so that said first operating cycle and the second operating cycle will be carried out alternately; and
   a circuit for performing timing control of said third control signal and said second control signal so that said third circuit in said first operating cycle and said first circuit in said second operating cycle are in operation in parallel.

3. The semiconductor device according to claim 2, wherein said fourth control signal and the sixth control signal are generated based on the transition of said first transition of said input clock signal.

4. A semiconductor device, comprising:
   a first circuit being activated by a first control signal generated based on a first transition of an input clock signal to effect a first operation for a first time period A;
   a second circuit being activated by a second control signal generated based on a second transition of said input clock signal next following said transition of said input clock signal to effect a second operation for a second time period B, said first operation and said second operation being executed in alternate cyclic operations; and
   means for setting a period of said input clock signal to (A+B)/2 and for adding a delay of time (A−B)/2 to the delay of said input clock signal as from said first transition until the start of the operation of said first circuit in case of A>B.

5. A semiconductor device, comprising:
   a first circuit being activated by a first control signal generated based on a first transition of an input clock signal to effect a first operation for a first time period A;
   a second circuit being activated by a second control signal generated based on a second transition of said input clock signal next following said first transition of said input clock signal to effect a second operation for a second time period B, said first operation and said second operation performing alternate cyclic operations; and
   means for setting a period of said input clock signal to (A+B)/2 and for adding a delay of time (B−A)/2 to the delay of said input clock signal as from said first transition until the start of the operation of said first circuit when B>A.

6. A method for controlling a semiconductor device, comprising:
   a first circuit activated by a first control signal, generated based on a first transition of an input clock signal, to effect a first operation for a first time period A, and a second circuit activated by a second control signal generated based on a second transition of said input clock signal next following said first transition of said input clock signal to effect a second operation for a second time period B, said first operation and said second operation performing alternate cyclic operations, wherein said method comprises the steps of:

setting the period of said input clock signal to (A+B)/2; and adding a delay of time (A−B)/2 to the delay of said input clock signal as from said first transition until the start of the operation of said first circuit when A>B.

7. A method for controlling a semiconductor device, comprising:

a first circuit activated by a first control signal generated based on a first transition of an input clock signal to effect a first operation for a first time period A, and a second circuit activated by a second control signal generated based on a second transition of said input clock signal next following said first transition of said input clock signal to effect a second operation for a second time period B, said first operation and said second operation performing alternate cyclic operations;

wherein said method comprises the steps of:

setting the period of said input clock signal to (A+B)/2; and adding a delay of time (A−B)/2 to the delay of said input clock signal as from said second transition until the start of the operation of said second circuit when B>A.

* * * * *